US012685100B2

(12) United States Patent
Chuang et al.

(10) Patent No.:  US 12,685,100 B2
(45) Date of Patent:       Jul. 14, 2026

(54) REDISTRIBUTION LAYER METALLIC STRUCTURE AND METHOD

(71) Applicant: Taiwan Semiconductor Manufacturing Company, Ltd., Hsin-Chu (TW)

(72) Inventors: Harry-Haklay Chuang, Zhubei (TW); Wei Cheng Wu, Hsinchu County (TW); Chung-Jen Huang, Tainan (TW); Wen-Tuo Huang, Tainan (TW); Chia-Sheng Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 610 days.

(21) Appl. No.: 18/181,293

(22) Filed: Mar. 9, 2023

(65) Prior Publication Data

US 2023/0377968 A1      Nov. 23, 2023

Related U.S. Application Data

(60) Provisional application No. 63/342,712, filed on May 17, 2022.

(51) Int. Cl.
H01L 21/768          (2006.01)
H01L 21/762          (2006.01)
(Continued)

(52) U.S. Cl.
CPC .. H01L 21/76898 (2013.01); H01L 21/76232 (2013.01); H01L 21/76816 (2013.01); H01L 21/7684 (2013.01); H01L 21/76877 (2013.01);

H01L 23/481 (2013.01); H01L 23/5226 (2013.01); H01L 23/5227 (2013.01);
(Continued)

(58) Field of Classification Search
CPC .... H10D 64/519; H10D 62/151; H10D 30/63; H01L 21/76897; H01L 21/76877; H01L 21/76885; H01L 21/76898; H01L 21/76232; H01L 21/76816; H01L 21/7684;
(Continued)

(56) References Cited

U.S. PATENT DOCUMENTS 11,158,634 B1     10/2021  Huang et al.
11,417,628 B2 *    8/2022  Chen ...................... H01L 24/11
(Continued)

*Primary Examiner* — John M Parker
(74) *Attorney, Agent, or Firm* — HAYNES AND BOONE, LLP

(57)               ABSTRACT

A method includes forming first IC devices on a first frontside of a first semiconductor substrate and second IC devices on a second frontside of a second semiconductor substrate; forming a first contact pad over the first IC devices from the first frontside and a second contact pad over the second IC device from the second frontside; bonding the first and second contact pads such that the first and second IC devices are electrically connected; and forming a conductive structure on a first backside of the first semiconductor substrate. The conductive structure includes a through via (TV), a backside metal (BSM) feature, and a backside redistribution layer (BRDL). The TV is extending through the first semiconductor substrate and electrically connected the first and second IC devices to the BRDL, and the BSM feature is extended into a portion of the first semiconductor substrate and electrically connected to the TV.

20 Claims, 29 Drawing Sheets

(51) Int. Cl.

| | |
|---|---|
| *H01L 23/00* | (2006.01) |
| *H01L 23/48* | (2006.01) |
| *H01L 23/522* | (2006.01) |
| *H01L 23/528* | (2006.01) |
| *H01L 25/065* | (2023.01) |

(52) U.S. Cl.
CPC .......... *H01L 23/5283* (2013.01); *H01L 24/08* (2013.01); *H01L 24/80* (2013.01); *H01L 25/0657* (2013.01); *H01L 2224/02311* (2013.01); *H01L 2224/0235* (2013.01); *H01L 2224/02372* (2013.01); *H01L 2224/02381* (2013.01); *H01L 2224/08145* (2013.01); *H01L 2224/80895* (2013.01); *H01L 2224/80896* (2013.01); *H01L 2225/06527* (2013.01); *H01L 2225/06544* (2013.01); *H01L 2225/06589* (2013.01); *H01L 2924/1815* (2013.01)

(58) Field of Classification Search
CPC ............ H01L 23/5226; H01L 23/5227; H01L 25/0657; H01L 25/50
See application file for complete search history.

(56) References Cited

U.S. PATENT DOCUMENTS

| | | | | |
|---|---|---|---|---|
| 11,450,665 | B2 | 9/2022 | Chiang et al. | |
| 11,532,556 | B2 | 12/2022 | Huang et al. | |
| 2014/0008757 | A1* | 1/2014 | Ramachandran | H01L 23/481 |
| | | | | 438/424 |
| 2015/0262989 | A1* | 9/2015 | Kawasaki | H01L 25/0657 |
| | | | | 257/737 |
| 2016/0233261 | A1* | 8/2016 | Hsu | H10F 39/014 |
| 2016/0254306 | A1* | 9/2016 | Chen | H10F 39/8063 |
| | | | | 257/292 |
| 2017/0047301 | A1* | 2/2017 | Yang | H01L 24/08 |
| 2019/0148342 | A1* | 5/2019 | Hu | H01L 23/552 |
| | | | | 257/659 |
| 2020/0152608 | A1* | 5/2020 | Hu | H01L 24/05 |
| 2022/0262768 | A1* | 8/2022 | Chen | H01L 25/18 |
| 2022/0359269 | A1* | 11/2022 | Chuang | H01L 21/02172 |
| 2023/0230901 | A1* | 7/2023 | Farooq | H01L 23/481 |
| | | | | 257/774 |
| 2023/0260941 | A1* | 8/2023 | Hu | H01L 21/76816 |
| 2023/0369302 | A1* | 11/2023 | Yu | H01L 21/6835 |

* cited by examiner

REDISTRIBUTION LAYER METALLIC STRUCTURE AND METHOD

This application claims priority to U.S. Provisional Patent Application Ser. No. 63/342,712 filed May 17, 2022, the entire disclosure of which is hereby incorporated herein by reference.

BACKGROUND

In semiconductor industry, integrated circuits (ICs) are formed on a semiconductor substrate and are saw to IC chips. Each IC chip is further attached (such as by bonding) to a circuit board, such as a printed circuit board in electric products. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed. Other challenges introduced through the scaling down process includes power dissipation, thermal managements, limited circuit areas, and device performance. Therefore, although existing structures have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
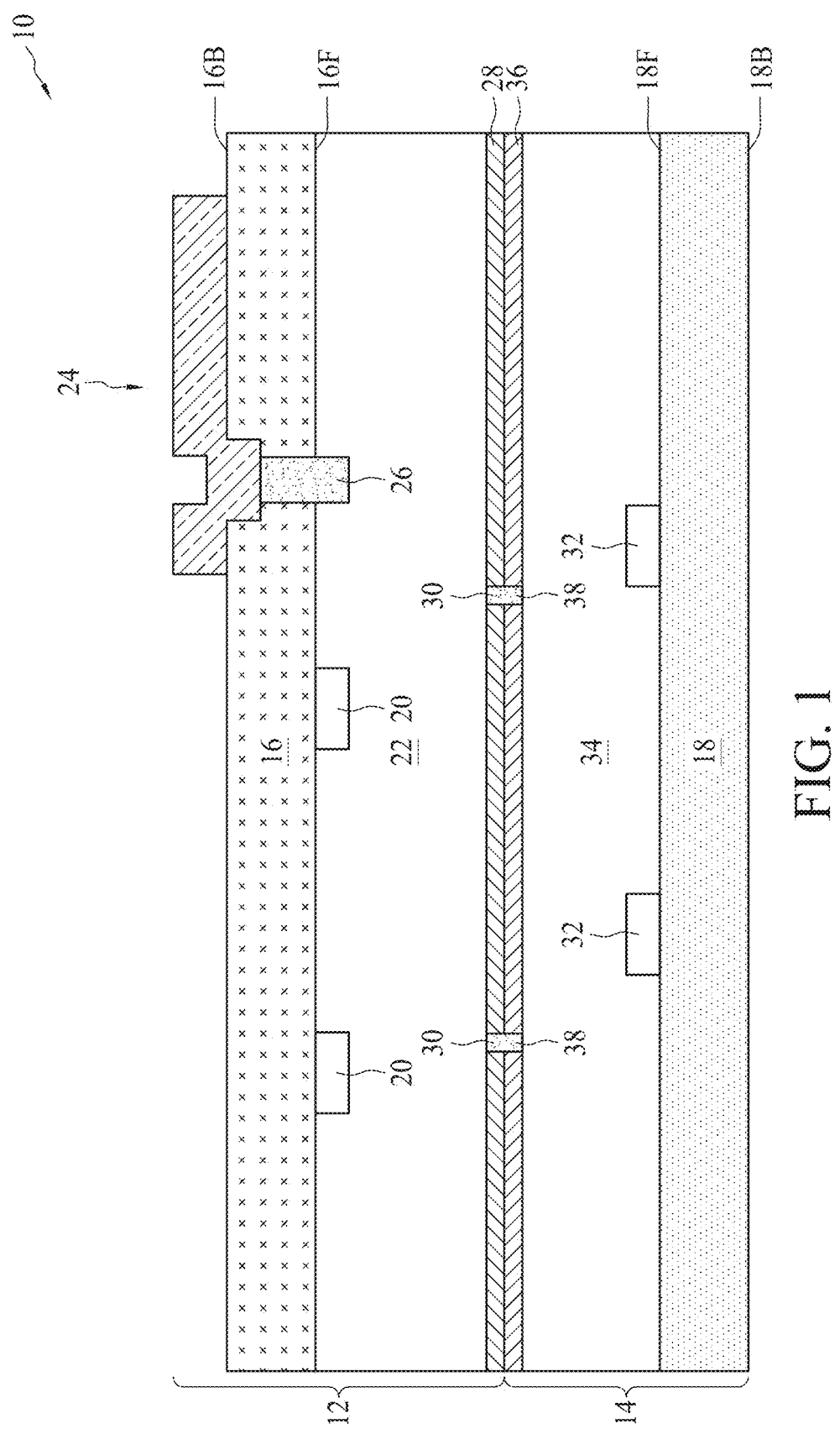
FIG. 1 is a cross-sectional view of an integrated circuit structure constructed according to various aspects of the present disclosure in some embodiments.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

FIG. 1 is a sectional view of an integrated circuit (IC) structure (or semiconductor structure) 10 constructed according to various aspects of the present disclosure in accordance with various embodiments. The IC structure 10 includes two circuit chips 12 and 14 bonded together. In the disclosed embodiment, as described later in detail, two semiconductor wafers are fabricated with respective circuit features, are bonded together, and are diced into a plurality of integrated circuits. For convenience of description, circuit chips 12 and 14 are also referred to as a first workpiece 12 and a second workpiece 14. In furtherance of the embodiment, the two workpieces 12 and 14 are semiconductor wafers before bonding and are chips after dicing.

The first workpiece 12 includes a first semiconductor substrate 16, such as a silicon substrate. The second workpiece 14 includes a second semiconductor substrate 18, such as a silicon substrate. The first workpiece 12 and the second workpiece 14 are bonded together to form a three-dimension (3D) circuit structure. Especially, the first substrate 16 includes a frontside 16F and a backside 16B. Various devices 20, such as field-effect transistors (FETs), fin FETs (FinFETs), Multi-gate devices (e.g. gate-all-around (GAA) devices), other suitable devices or a combination thereof, are formed on the frontside 16F of the first substrate 16. Various devices are formed on active regions, which may be fin-like active regions extruded above the surface of the isolation features, such as shallow trench isolation (STI) features.

A first interconnect structure 22 is formed over the devices 20 on the frontside 16F of the first substrate 16. The first interconnect structure 22 may include multiple conductive layers to provide electrical routing vertically and horizontally to couple the devices 20 into an integrated circuit. Particularly, the first interconnect structure 22 includes metal lines distributed in multiple layers, contacts between the lowest metal layer and the substrate, and vias between adjacent metal layers. The first interconnect structure 22 is embedded in one or more dielectric layer to provide proper isolation, such as one or more interlayer dielectric (ILD) layer and various etch stop layers. Various conductive features are formed by one or more conductive material, such as metal, metal alloy, or silicide. For examples, the metal lines may include copper, aluminum copper alloy, other suitable conductive material, or a combination thereof. The vias may include copper, aluminum copper alloy, other suitable conductive material, or a combination thereof. The contacts may include tungsten, silicide, nickel, cobalt, copper, other suitable conductive material, or a combination thereof. In some examples, various conductive features may further include a barrier layer, such as tantalum and tantalum nitride, titanium and titanium nitride. In the present embodiment, the top metal lines include copper. An ILD layer includes one or more dielectric material to provide isolation functions to various device components (such as gates) and various conductive features (such as metal lines, contacts and vias). The ILD layer includes a dielectric material, such as silicon oxide, a low-k dielectric material, other suitable dielectric material, or a combination thereof. In some examples, the low-k dielectric material includes fluorinated silica glass (FSG), carbon doped silicon oxide, Xerogel, Aerogel, amorphous fluorinated carbon, Parylene, BCB (bisbenzocyclobutenes), polyimide, and/or other suitable dielectric materials with dielectric constant substantially less than that of the thermal silicon oxide. The formation of the ILD layer includes deposition and CMP, for examples. The deposition may include spin-on coating, CVD, other suitable deposition technology or a combination thereof. The ILD layer may include multiple layers and is collectively formed with various conductive features in a proper procedure, such as damascene process.

In some embodiments, the first workpiece 12 includes a frontside passivation layer 28 and a first bonding layer 30 embedded in the frontside passivation layer 28. The frontside passivation layer 28 may include one or more suitable dielectric material layers, such as silicon oxide, silicon nitride, silicon oxynitride, other suitable dielectric material, or a combination thereof.

The first bonding layer 30 includes various conductive features as first contact pads (also referred by numeral 30) connected to the first interconnect structure and further coupled to the second workpiece 14, which will be further described later. A conductive structure 24 is further formed on the backside 16B of the first substrate 16 and includes through vias (TVs) 26. In some embodiments, the TV 26 is a through-substrate via or a through-silicon via. The conductive structure 24 is electrically connected to the first interconnect structure 22 disposed on the frontside 16F of the first substrate 16 through TVs 26. TV 26 are conductive plugs (such as metal plugs) extending through the first substrate 16. In the disclosed embodiment, the conductive structure 24 include bond pads; backside metal features that are extended in the first semiconductor substrate 16; and one or more inductor, which is integrated with the backside metal routing features and is partially embedded in the semiconductor substrate as well. In some embodiments, the conductive structure 24 further includes conductive features designed and configured to function for thermal dissipation. The conductive structure 24 will be further described in detail at later stage.

Similarly, the second workpiece 14 includes a second semiconductor substrate 18 bonded to the first workpiece 12. The second substrate 18 includes a frontside 18F and a backside 18B. Various devices 32, such as FETs, FinFETs, Multi-gate devices, other suitable devices or a combination thereof, are formed on the frontside 18F of the second substrate 18. A second interconnect structure 34 is formed over the devices 32 on the frontside 18F of the second substrate 18. The second interconnect structure 34 is similar to the first interconnect structure 22 in terms of structure and formation. For example, the second interconnect structure 34 may include multiple conductive layers to provide electrical routing vertically and horizontally to couple the devices 32 into an integrated circuit. The second interconnect structure 34 may include metal lines distributed in multiple layers, contacts between the lowest metal layer and the substrate, and vias between adjacent metal layers. The second interconnect structure 34 is embedded in one or more dielectric layer to provide proper isolation. In some embodiments, the second workpiece 14 includes a frontside passivation layer 36 and a second bonding layer 38 embedded in the frontside passivation layer 36. The second bonding layer 38 includes various conductive features as second contact pads (also referred by numeral 38) configured to be aligned with the first contact pads of the first bonding layer 30 when the two workpieces are bonded together such that the first contact pads of the first bonding layer 30 and the second contact pads of the second bonding layer 38 are respectively bonded and electrically connected, thereby forming a bonding structure. Especially, the first substrate 16 and the second substrate 18 are bonded such that the corresponding frontside surfaces are facing each other with backside surfaces are exposed. As stated above, the conductive structure 24 of the first workpiece 12 on the backside 16B serves various functions, including bonding structure to be connected to the package or printed circuit board.

The disclosed IC structure 10 and method making the same provide increased design feasibility, design flexibility, circuit packing density in a 3D mode. In various embodiments, devices and circuits of the IC structure 10 are distributed on two substrates 16 and 18. As an embodiment for illustration, the first workpiece 12 includes processing circuit formed on the first substrate 16 and the second workpiece 14 includes memory circuit formed on the second substrate 18. In another embodiment, the first workpiece 12 includes artificial intelligence processing circuit formed on the first substrate 16 and the second workpiece 14 includes power delivery circuit formed on the second substrate 18.

Figure 2:
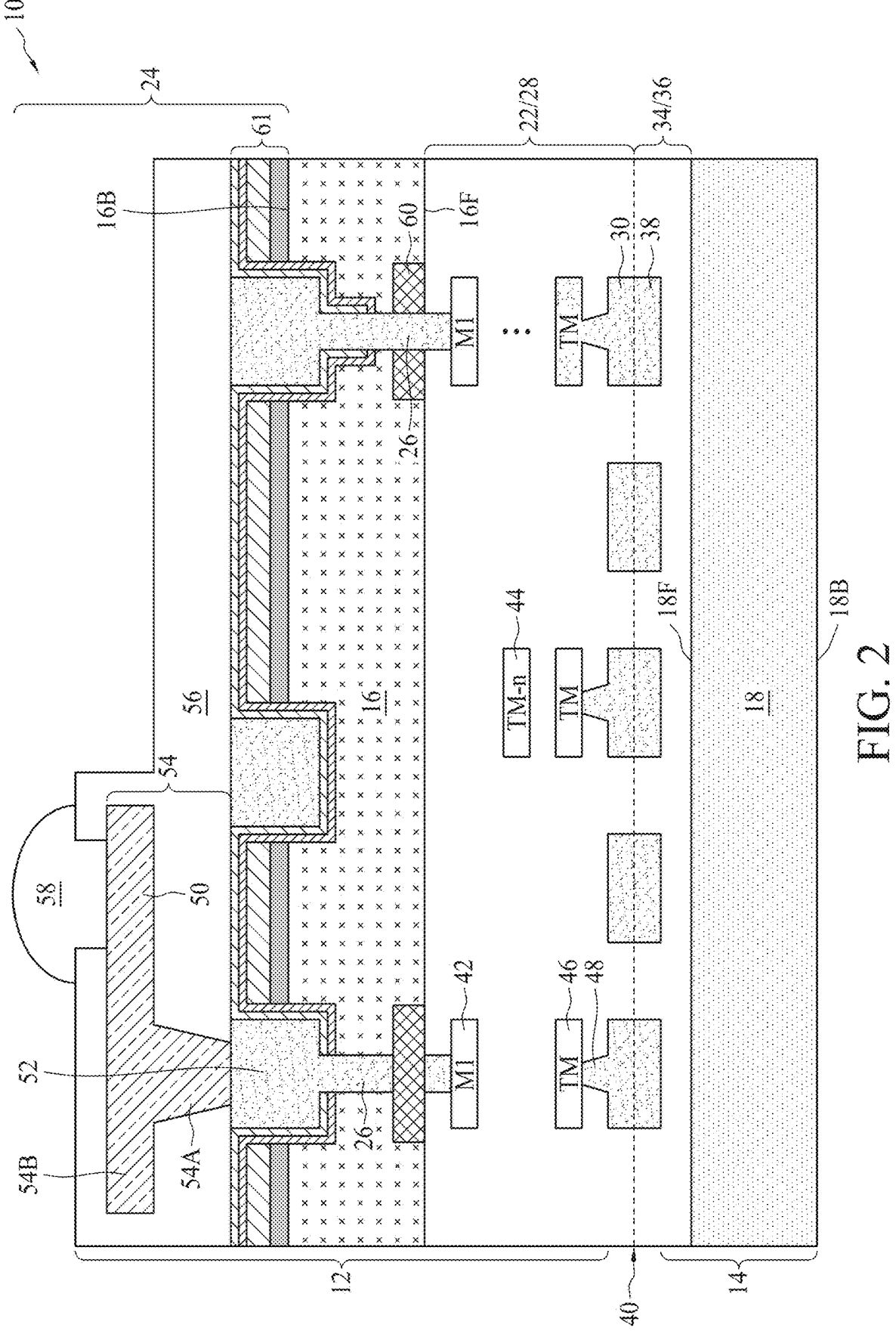
FIG. 2 is a cross-sectional view of the IC structure of FIG. 1, in portion, constructed according to various aspects of the present disclosure in some embodiments.

FIG. 2 is a sectional view of the IC structure 10 constructed according to various aspects of the present disclosure in one embodiment. The IC structure 10 is similar to the IC structure 10 of FIG. 1. Similar features (such as devices 20 and 32) are not repeated for simplicity. Similar descriptions are not repeated.

The IC structure 10 includes two workpieces 12 and 14 bonded together, through contact pads 30 and 38, forming a bonding interface 40. The first workpiece 12 includes a first semiconductor substrate 16. The second workpiece 14 includes a second semiconductor substrate 18. The first workpiece 12 and the second workpiece 14 are bonded together to form a 3D circuit structure. A first interconnect structure 22 is formed over the devices 20 on the frontside 16F of the first substrate 16. The first interconnect structure 22 includes metal lines distributed in multiple layers, contacts between the lowest metal layer and the substrate, and vias between adjacent metal layers. The first interconnect structure 22 is embedded in one or more dielectric layer to provide proper isolation. Particularly, the first interconnect structure 22 includes first metal lines (M1) 42 in a first metal layer, second metal lines (not shown) in a second metal layer, . . . , n$^{th}$ metal lines 44 in a n$^{th}$ metal layer, . . . and top metal lines (TM) 46 in a top metal layer. The top metal lines 46 are connected to the first contact pads 30 through metal plugs 48. Contact pads 30 and 38 may present for other functions, such as enhancing the bonding strength, tuning contact pad pattern density. The first contact pads 30 may be embedded in the frontside passivation layer 28 or alternatively other suitable dielectric layer, such as silicon oxide.

The conductive structure 24 is further formed on the backside 16B of the first substrate 16 and is electrically connected to the first interconnect structure 22 disposed on the frontside 16F of the first substrate 16 by TVs 26. TVs 26 are metal plugs extending through the first substrate 16 to provide connection to the outside packaging or printed circuit board. In the disclosed embodiment, the conductive structure 24 include bond pads 50; backside metal features (BSM) 52 that are extended into a portion of the first semiconductor substrate 16; and backside redistribution layer (BRDL) 54, which is integrated with the BSM features and is embedded in a passivation layer 56 disposed on the backside 16B of the first substrate 16. The BRDL 54 is disposed on the backside 16B of the first substrate 16 and is designed to redistribute bond pads, such as from the edge to the center of an IC chip for flip chip bonding or other suitable packaging technology to integrate an IC chip to a board (e.g., a printed circuit board). The BRDL 54 includes RDL metallic features embedded in the passivation layer 56 with bond pads in the openings of the passivation layer 56. The passivation layer 56 includes one or more suitable dielectric material layers, such as a silicon nitride (SiN) layer and an un-doped silica glass (USG) layer on the SiN layer.

The BSM features 52 are extended in the first substrate 16 and are disposed between the first substrate 16 and the passivation layer 56. The BSM features 52 include portions integrated with the TVs 26 and metal lines routing for interconnection (such as electrically connecting the TVs 26 to the BRDL 54) and other functions, such as inductance and thermal dissipation. BRDL 54 includes one or more metal layer configured to redistribute the bond pad 50 from a location of the corresponding first metal line 42 to a different location according to packaging or circuit board design. In the disclosed embodiment, the BRDL 54 includes backside redistribution vias (RVB) 54A embedded in the first substrate 16 and backside redistribution metal lines (or BRDL metal lines) 54B. The BRDL 54 is connected to the bond pad 50. Other bonding features, such as solder balls 58, are further formed on the bond pad 50 to provide the electrical connection to the packaging or printed circuit board. In some embodiments, the conductive structure 24 further includes conductive features designed and configured to function for thermal dissipation, inductors, or a combination thereof, which may be embedded or partially embedded in the first substrate 16 or disposed between the first substrate 16 and the passivation layer 56. In furtherance of the embodiment, the portions of the BSM features 52 are designed as thermal dissipation structures and inductors.

In the disclosed embodiment, the TVs 26 are positioned to penetrate through isolation features 60 formed on the frontside 16F of the first substrate 16 for various considerations, such as the isolation features 60 provide mechanical enhancement, reduction of the stress, and absence of functional devices on the isolation features 60. The isolation features 60 are dielectric features formed on the frontside 16F of the first substrate 16 to define active regions and provide isolation to various active regions. In some embodiments, the isolation features 60 include shallow trench isolation (STI) features, deep trench isolation (DTI) features, other suitable isolation features or a combination thereof. In one example, the STI features are formed by patterning the first substrate 16 from the frontside 16F to form shallow trenches by lithography process and etch; filling one or more dielectric materials in the shallow trenches by suitable deposition; and performing a chemical mechanical polishing (CMP) process.

In some embodiments, the IC structure 10 also includes other features, such as dielectric layer 61 as hard mask, liner, etch stop layer, other suitable functions, or a combination thereof. The dielectric layer 61 may include one or more dielectric materials, such as a silicon oxide and a silicon nitride layer deposited by a suitable technology, such as thermal oxidation, chemical vapor deposition (CVD), other suitable techniques, or a combination thereof.

In some embodiments, various conductive features may include a barrier layer to prevent from interdiffusion between the conductive features and adjacent dielectric materials, such as a barrier layer formed on the BSM features 52 and TVs 26. In furtherance of the embodiments, the barrier layer includes titanium (Ti), titanium nitride (TiN), tantalum (Ta), tantalum nitride (TaN), or a combination thereof, deposited by a suitable technology, such as physical vapor deposition (PVD).

Figure 3A:
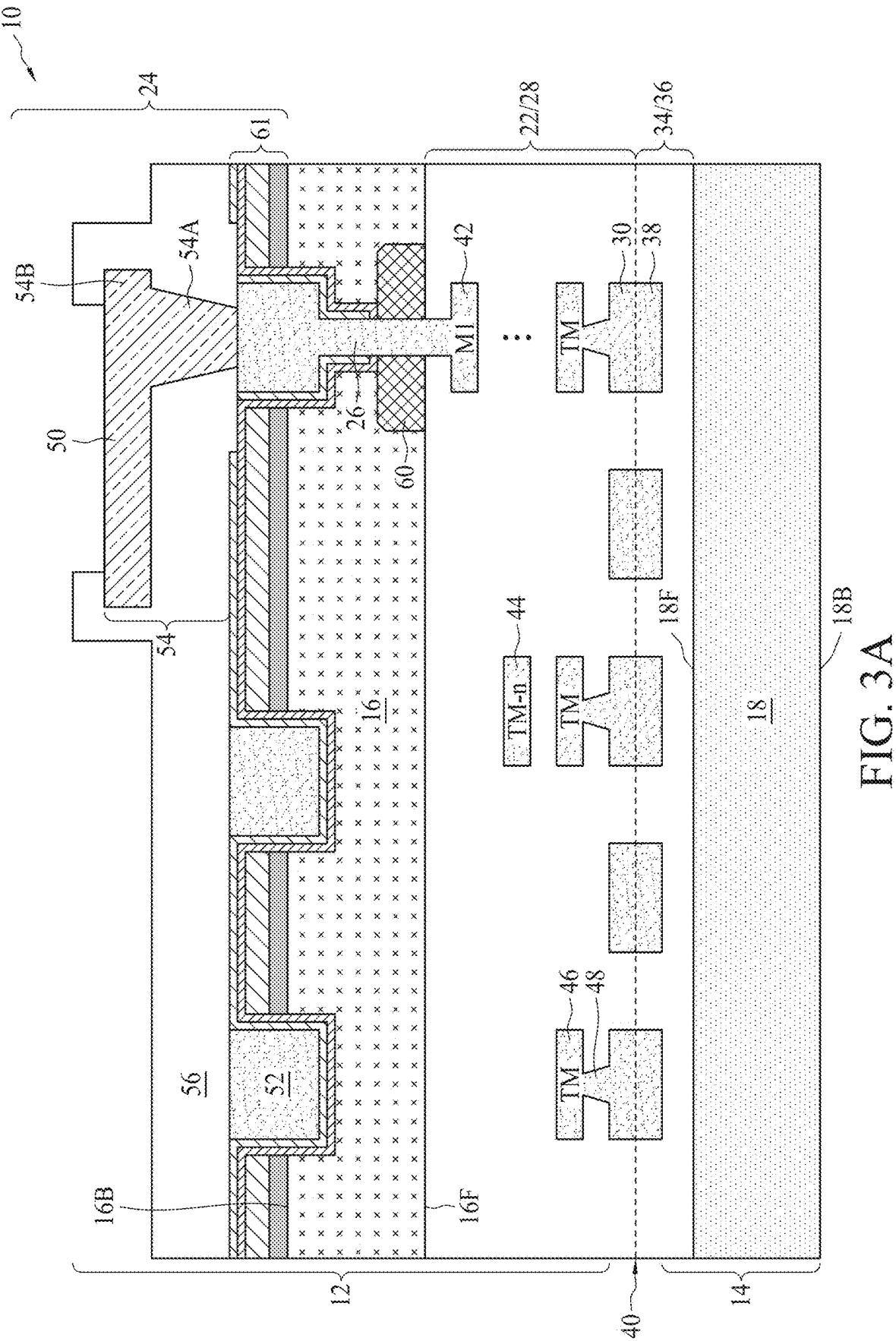
FIG. 3A is a cross-sectional view of the IC structure of FIG. 1, in portion, constructed according to various aspects of the present disclosure in some other embodiments.
Figure 3B:
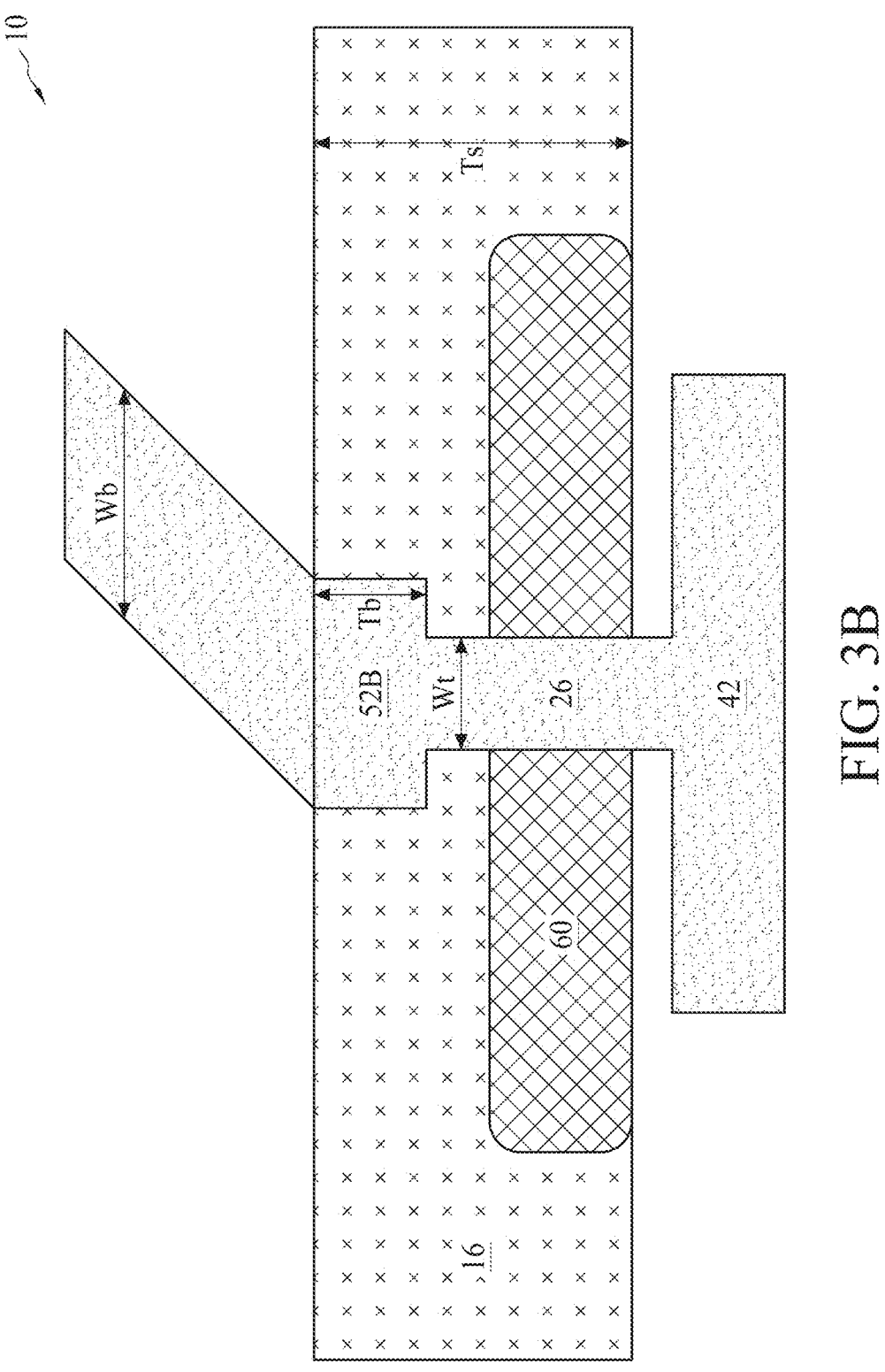
FIG. 3B is a perspective view of the IC structure of FIG. 1, in portion, constructed according to various aspects of the present disclosure in some other embodiments.

FIG. 3A is a sectional view of the IC structure 10 constructed according to other embodiments. FIG. 3B is a perspective view of portions of the IC structure 10 in accordance with some embodiments. The IC structure 10 in FIG. 3A is similar to the IC structure 10 in FIG. 2 and the descriptions of the similar features are not repeated. As illustrated in FIG. 3B as a zoom-in view of some features including the first substrate 16, the isolation feature 60, the first metal line 42, TV 26 and the BSM features 52. The first substrate 16 is thin-down to a thickness Ts during the backside process. The BSM features 52 are extended into the first substrate 16 and span a thickness Tb and a width Wb. The TV 26 spans a width Wt. Those dimensions are designed to provide enhanced performance to the integrated circuit, including efficient thermal dissipation, enhanced conductance, and stress reduction. In some embodiments, a Tb/Wb is greater than 1.3. In some embodiments, the Wb/Tb ranges between 1.3 and 1.5. In some embodiments, Ts ranges between 2.8 μm and 10 μm, Wb ranges between 0.6 μm and 4 μm, Tb ranges between 0.8 μm and 5.5 μm, and Wt ranges between 0.6 μm and 3.8 μm. In another embodiment, a ratio Ts/Tb ranges between 2 and 3.

Figure 4:
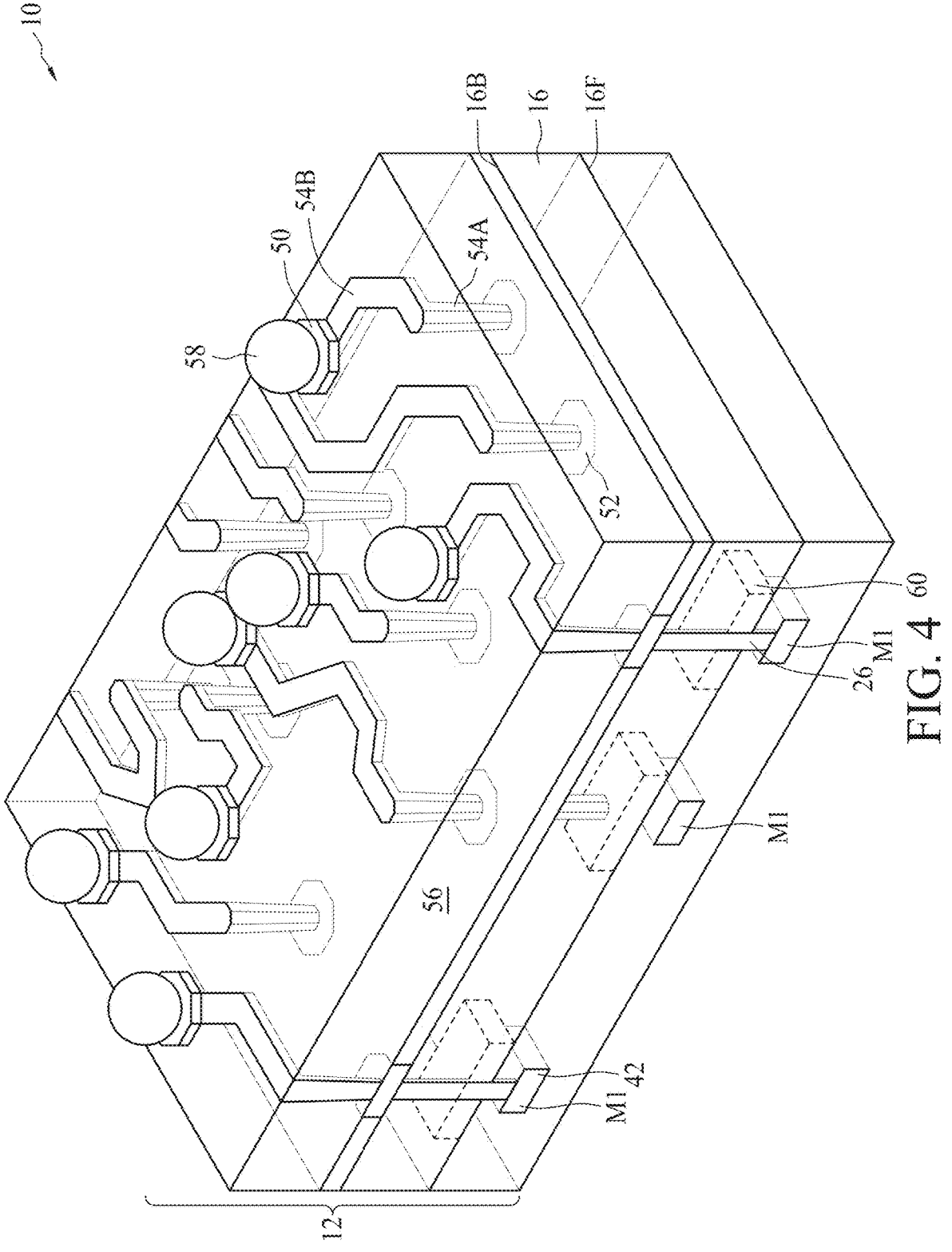
FIG. 4 is a perspective view of the IC structure of FIG. 1, in portion, constructed according to various aspects of the present disclosure in some embodiments.

FIG. 4 is a perspective view of portions of the IC structure 10 in accordance with some embodiments. Especially, only the first workpiece 12 is illustrated in FIG. 4. The descriptions of the similar features are not repeated. As illustrated in FIG. 4, the TVs 26 extend through the first substrate 16 from the backside 16B and the frontside 16F, connecting the BRDLs 54 to the first metal lines 42, especially penetrating through corresponding isolation features 60. The BSM features 52 are extended in the first substrate 16 and further connected to the TV 26 from the bottom and connected to the BRDL 54 from the top. Furthermore, the TV 26 is overlapped with the isolation feature 60 and the BSM features 52 in a top view. In furtherance of the embodiment, the portions of the BSM features 52 are designed as thermal dissipation structures, inductors or both, as illustrated in FIG. 5.

Figure 5:
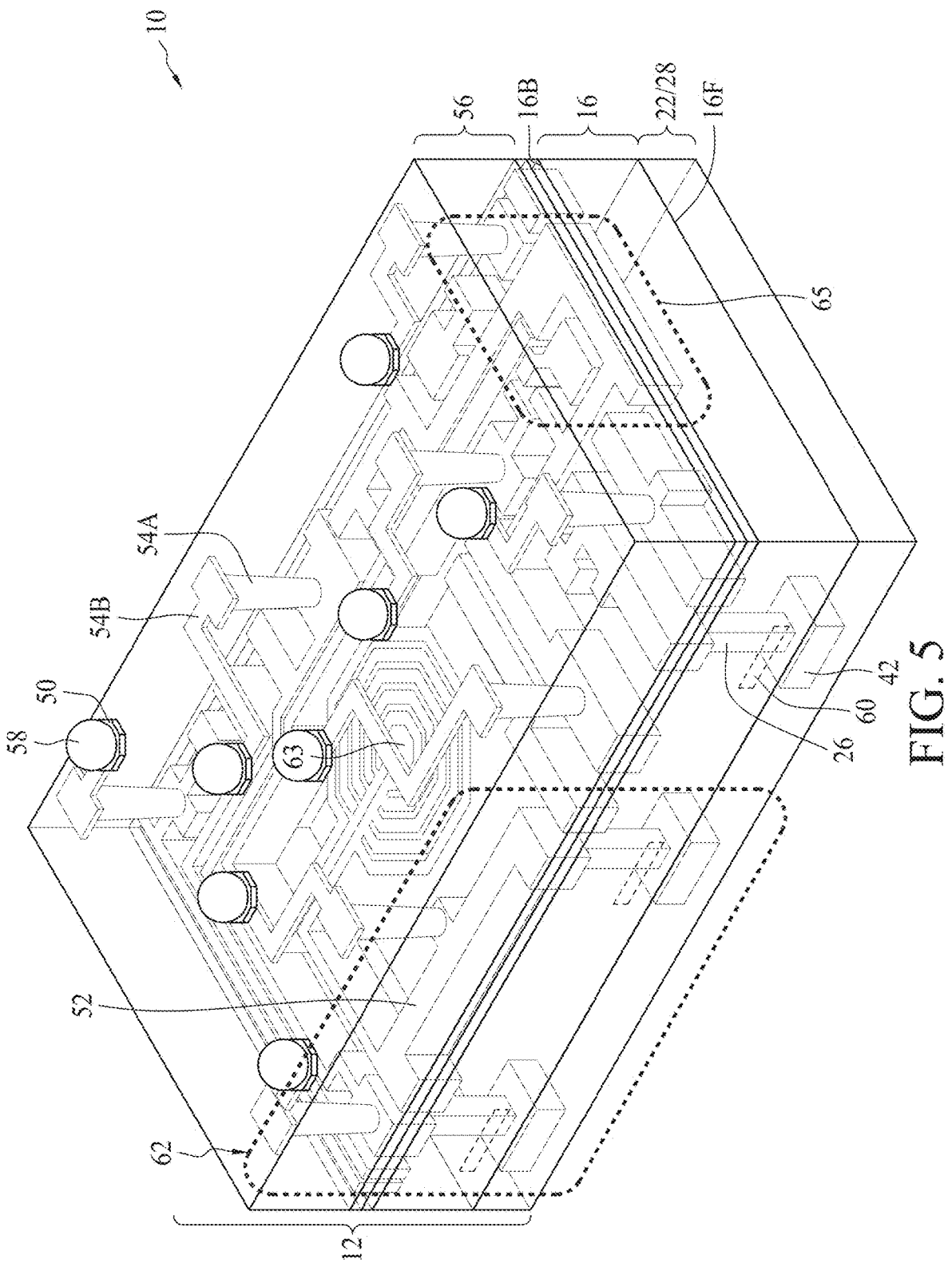
FIG. 5 is a perspective view of the IC structure of FIG. 1, in portion, constructed according to various aspects of the present disclosure in some other embodiments.

FIG. 5 is a perspective view of portions of the IC structure 10 in accordance with some embodiments. Especially, only the first workpiece 12 is illustrated in FIG. 5. The descriptions of the similar features are not repeated. As illustrated in FIG. 5, the TVs 26 extend through the first substrate 16 from the backside 16B and the frontside 16F, connecting the BRDLs 54 to the first metal lines 42, especially penetrating through corresponding isolation features 60. The BSM features 52 are extended in the first substrate 16 and further connected to the TV 26 from the bottom and connected to the BRDL 54 from the top. Furthermore, the BSM features 52 include portions configured for electrical connections. The BSM features 52 further include other portions designed for thermal dissipation structures and inductors. For example, the BSM features 52 include an inductor 63 and routing features in a dashed line box 62. The inductor 63 is designed in a coil structure or other suitable structure to have desired inductance. In another example, the BSM features 52 include portions in a dashed line box 65 designed for thermal dissipation.

Figure 6A:
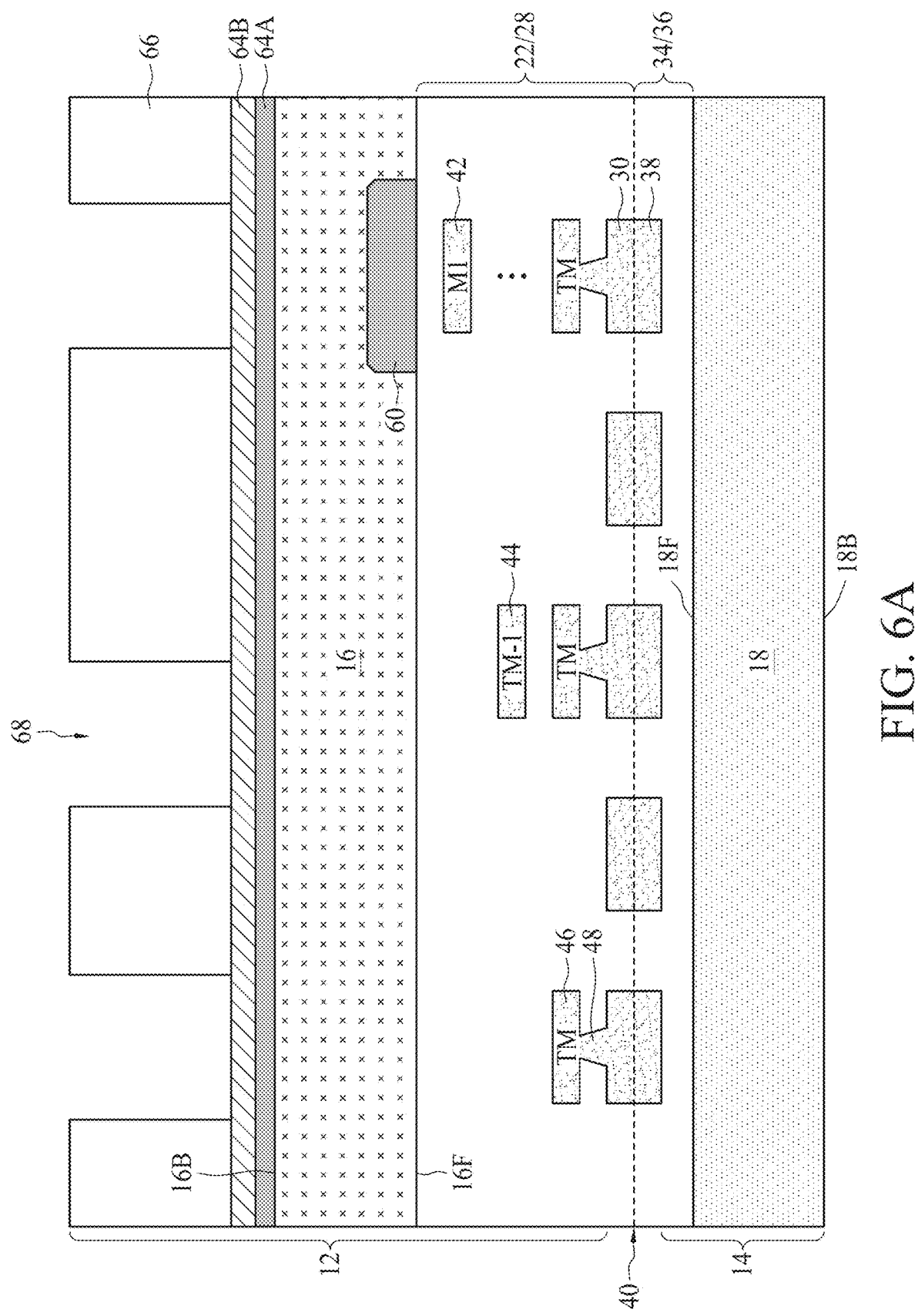
FIGS. 6A, 6B, 6C, 6D, 6E, 6F, 6G, and 6H are cross-sectional views of the IC structure of FIG. 1, in portion, at various fabrication stages, constructed according to various aspects of the present disclosure in some embodiments.

The present disclosure provides an IC structure 10 according to various embodiments. The method making the IC structure 10 is further described according to FIGS. 6A-6H. FIGS. 6A-6H are cross-sectional views of the IC structure 10 at various fabrication stages constructed according to various aspects of the present disclosure. The method is directed to the formation of the conductive structure 24 disposed on the backside 16B of the first substrate 16, especially TVs 26. In FIG. 6A, various features of the two workpieces 12 and 14, including devices 20 and 32, interconnect structures 22 and 34, frontside passivation layers 28 and 36, and contact pads 30 and 38 are formed on the frontside of the first and second substrates 16 and 18, respectively. The two workpieces 12 and 14 are bonded together and electrically connected through contact pads 30 and 38.

Referring to FIG. 6A, a hard mask 64 is formed on the backside of the first substrate 16. The hard mask 64 includes one or more dielectric layer. In the disclosed embodiment, the hard mask 64 includes two layers, a first hard mask layer (such as a silicon oxide layer) 64A formed by thermal oxidation and a second hard mask layer (such as a silicon nitride layer) 64B over the first hard mask layer. The silicon nitride layer 64B may be formed by chemical vapor deposition (CVD). A patterned photoresist layer 66 is formed by a photolithography process that may further include coating, exposure, and development, and may further include various baking processes at different stages. The patterned photoresist layer 66 includes various openings 68 that define regions for the BSM features 52.

Figure 6B:
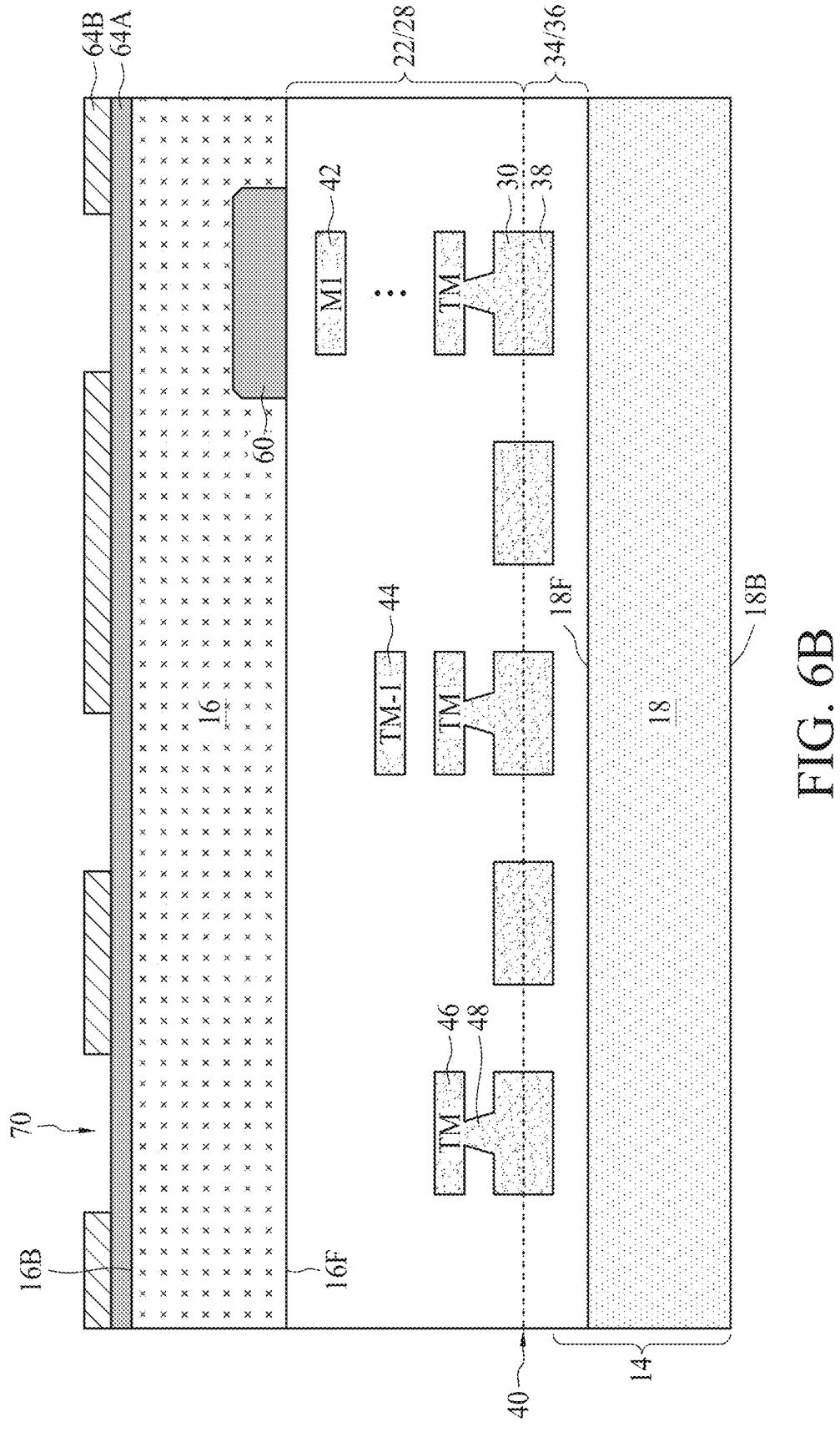

Referring to FIG. 6B, an etch process is applied to the hard mask through openings 68 of the patterned photoresist layer 66, thereby transferring the openings 68 to the hard mask 64, forming the openings 70. The etch process may include wet etch, dry etch, or a combination thereof, and may include multiple etch steps with respective etchants to selectively etch the hard mask 64. In the disclosed embodiment, the etch process selectively etch and open the second hard mask layer 64B within openings 70 that define regions for the BSM features 52. Accordingly, the etch process includes proper etchant, such as phosphorous acid, to selectively etch the second hard mask layer 64B. Particularly, a subset of the openings 70 are aligned with a subset of the isolation features 60 in a top view. The patterned photoresist layer 66 may be removed afterward by a suitable method, such as wet stripping or plasma ashing.

Figure 6C:
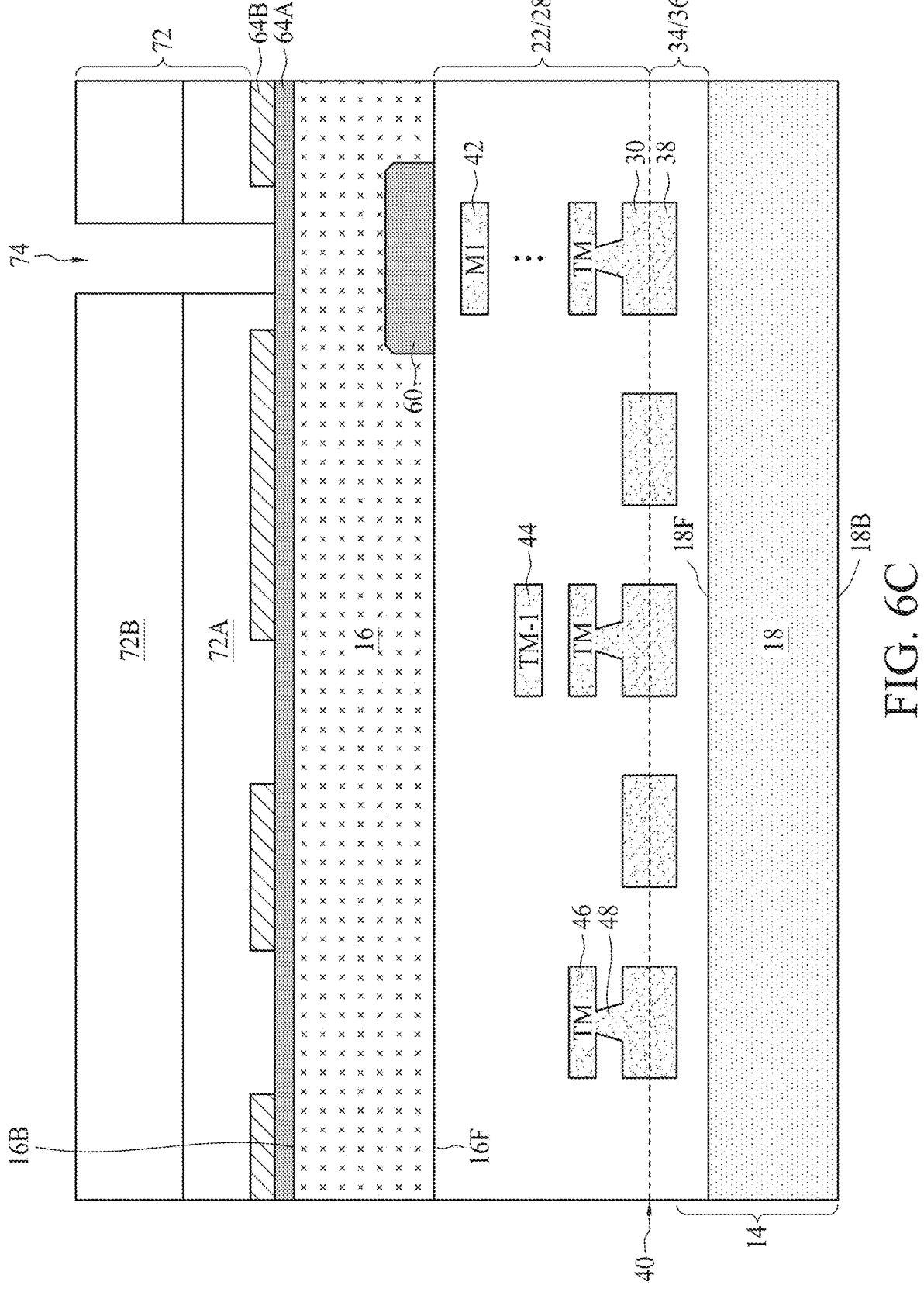

Referring to FIG. 6C, another patterned photoresist layer 72 is formed by a photolithography process. The patterned photoresist layer 72 includes various openings 74 that define regions for the TVs 26. The patterned photoresist layer 72 may include more than one layers, such as backside antireflection coating (BARC) layer 72A and a photosensitive material layer 72B sensitive to the radiation of the exposure process used to pattern the photoresist layer 72.

Figure 6D:
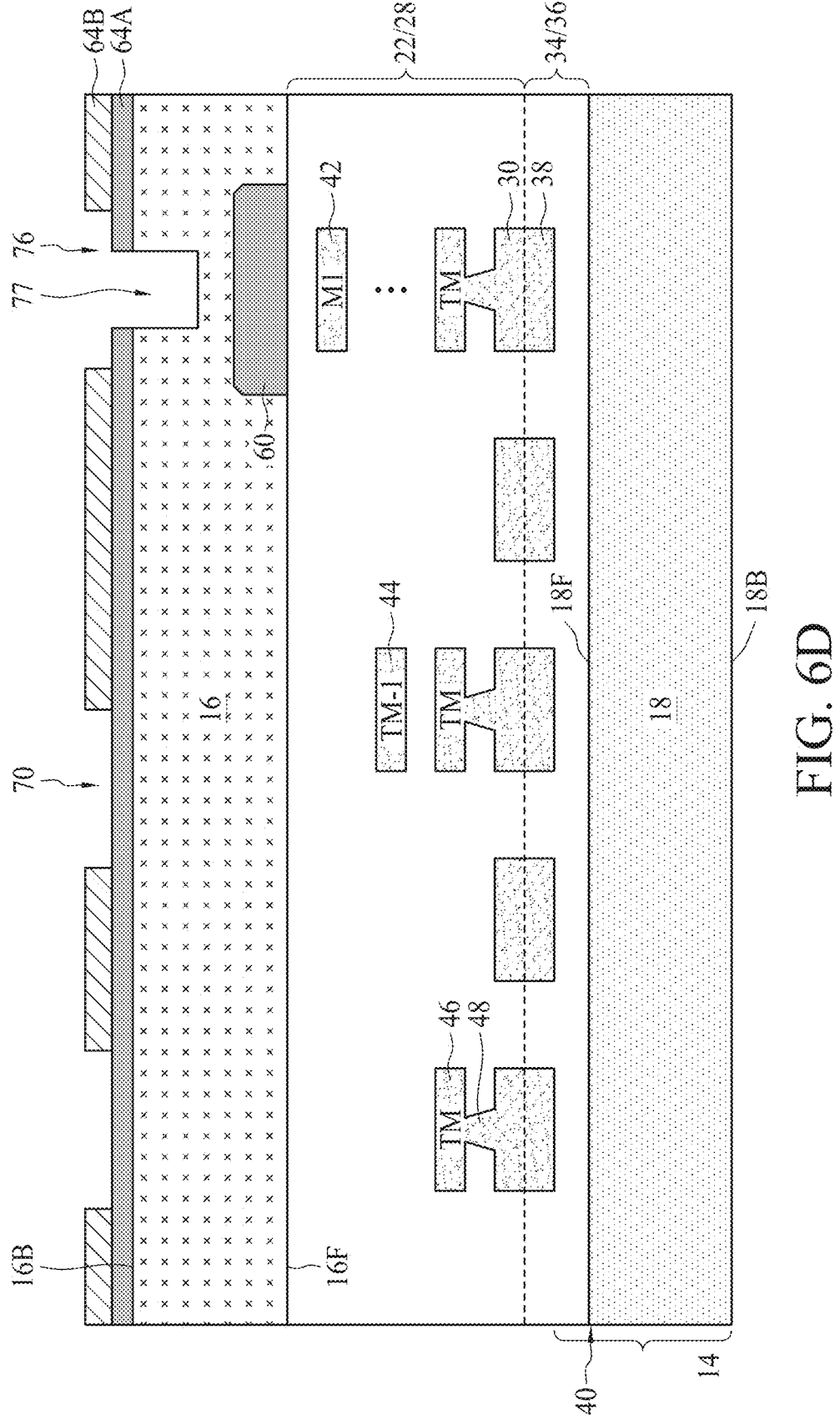

Referring to FIG. 6D, an etch process is applied to the hard mask through openings 74 of the patterned photoresist layer 72, thereby transferring the openings 74 to the first hard mask layer 64A, thereby forming openings 76 in the first hard mask layer 64A. The openings 76 define regions for TVs 26. The etch process may include wet etch, dry etch, or a combination thereof, and may include multiple etch steps with respective etchant, such as hydrofluoric acid, to selectively etch the first hard mask layer 64A. Particularly, a subset of the openings 76 are aligned with a subset of the isolation features 60 in a top view. The patterned photoresist layer 72 may be removed afterward by a suitable method, such as wet stripping or plasma ashing.

Still referring to FIG. 6D, another etch process is applied to the first substrate 16 using the hard mask 64 as an etch mask. Especially, the etch process is applied to the first substrate 16 through the openings 76 of the first hard mask layer 64A, thereby transferring the openings 76 to the first substrate 16 and forming trenches 77 in the first substrate 16.

Figure 6E:
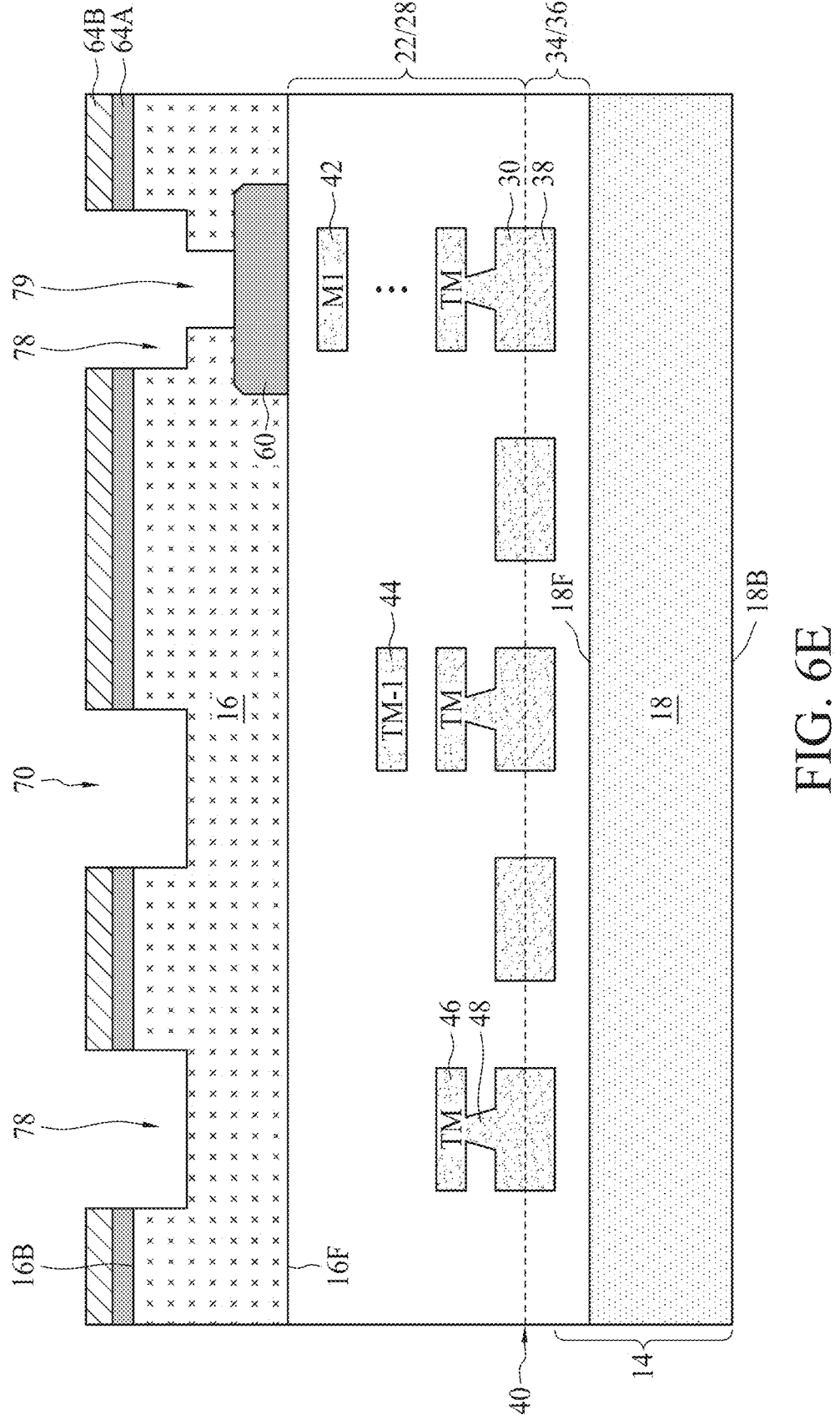

Referring to FIG. 6E, a first etch process is applied to selectively etch the exposed first hard mask layer 64A, thereby transferring the openings 70 from the second hard mask layer 64B to the first hard mask layer 64A, thereby forming collective openings 70 in the collective hard mask 64 including the first hard mask layer 64A and the second hard mask layer 64B.

Still referring to FIG. 6E, a second etch process is applied to the first substrate 16 using the collective hard mask 64 as an etch mask, forming trenches 78 for BSM features 52 and trenches 79 for TVs 26. Especially, the etch process is applied to the first substrate 16 through the openings 70 of the collective hard mask 64, thereby forming the trenches 78 and deepen the trenches 77 to form trenches 79 in the first substrate 16. The etch process is similar to the etch process applied to the first substrate 16 in FIG. 6D and may include wet etch, dry etch, or a combination thereof, with suitable etchant to selectively etch the first substrate 16. A subset of the trenches 78 is also aligned with the RVB 54A to be formed on the passivation layer 56.

Figure 6F:
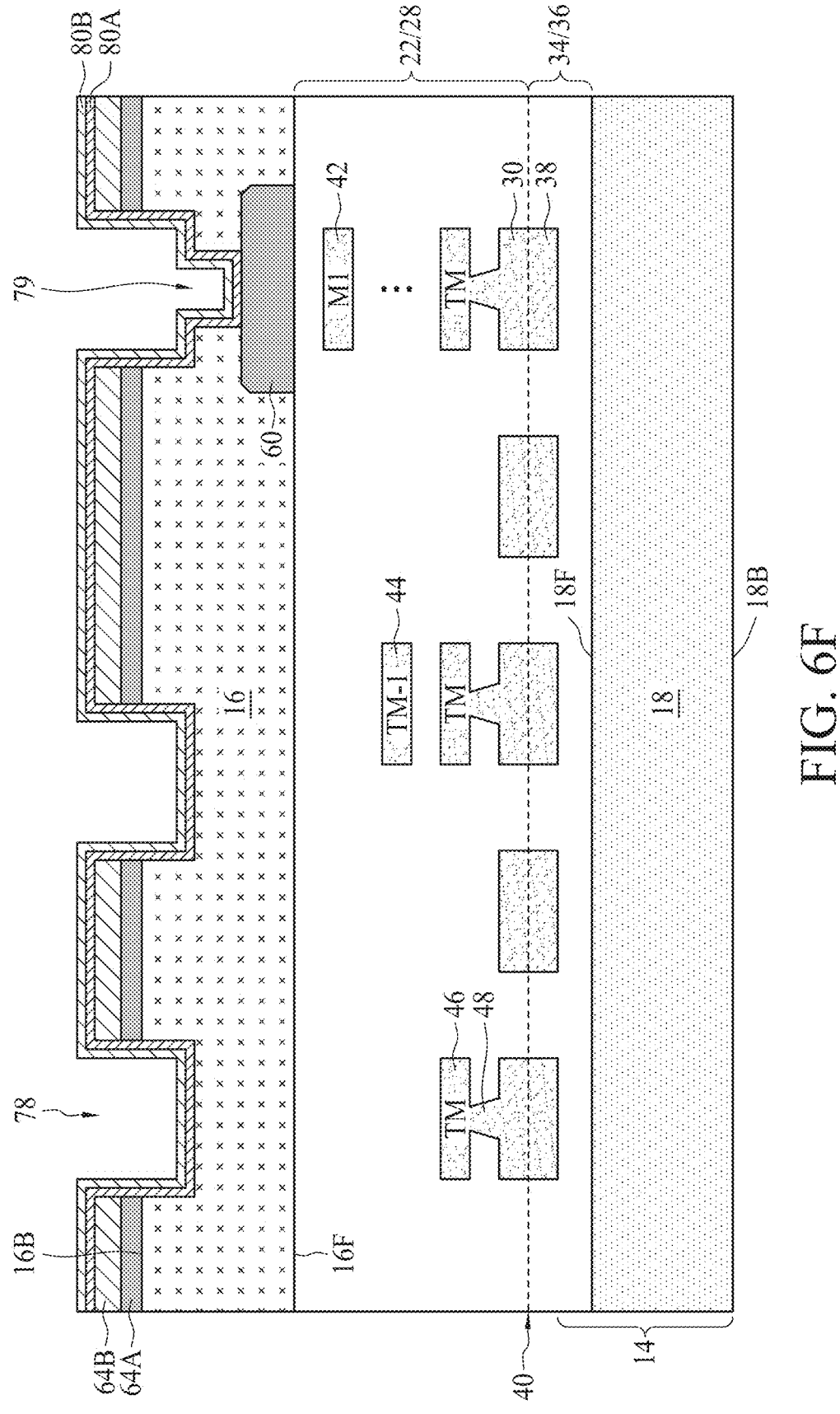

Referring to FIG. 6F, a dielectric material layer 80 is formed on various surfaces, including sidewalls and bottom surfaces of the trenches 78 and 79. The dielectric material layer 80 includes one or more dielectric material, such as a silicon oxide layer 80A formed by thermal oxidation or CVD, and a silicon nitride layer 80B on the silicon oxide layer 80A formed by CVD.

Figure 6G:
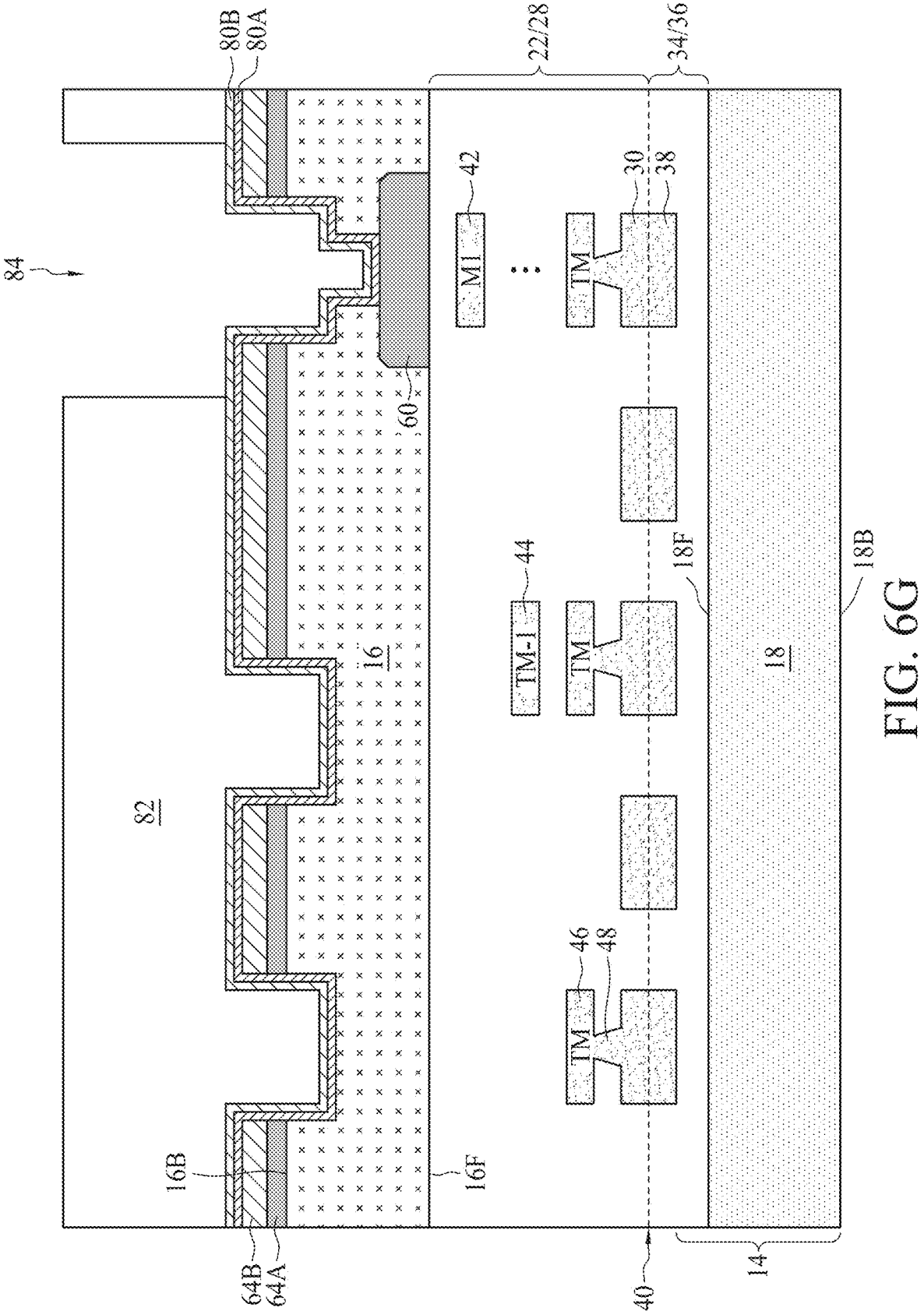

Referring to FIG. 6G, a patterned photoresist layer 82 is formed by a photolithography process and includes openings 84 that define regions for the TVs 26.

Figure 6H:
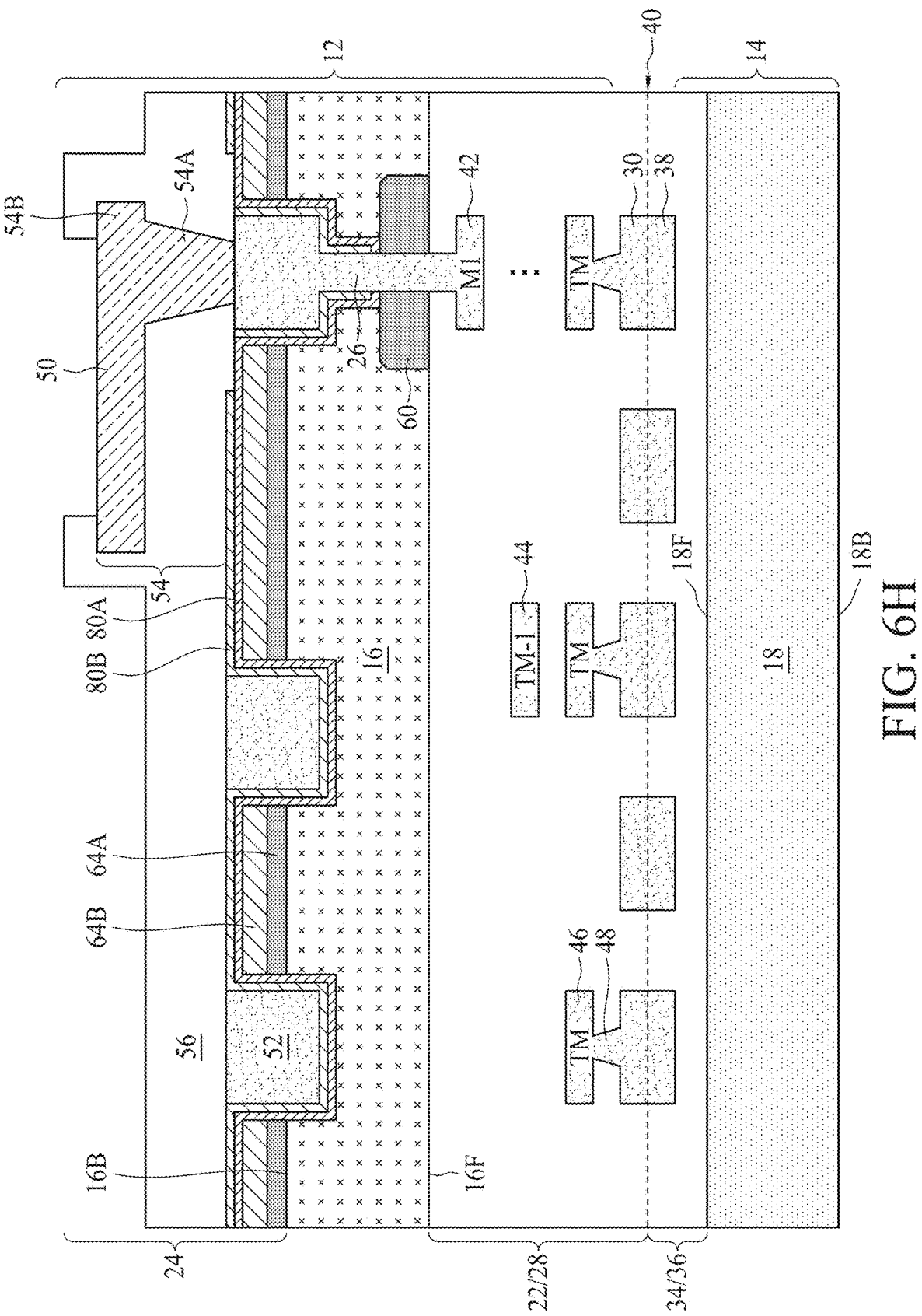

Referring to FIG. 6H, an etch process is applied to the first substrate 16 using the patterned photoresist layer 82 as an etch mask to etch through the dielectric material layer 80, the isolation features 60 and interlayer dielectric (ILD) layer of the interconnect structure 22 such that the first metal lines 42 are exposed within the openings 84. The etch process selectively etches various materials in the openings 84; may include wet etch, dry etch, or a combination thereof; and may include multiple etch steps with respective etchants to remove different materials within the openings 84. Thereafter, the patterned photoresist layer 82 may be removed by plasma ashing or wet stripping. Accordingly, the trenches for TVs 26 are formed by three patterning processes, including first two patterning processes described in FIGS. 6A-6F and a third patterning process described in FIGS. 6G-6H.

Still referring to FIG. 6H, various conductive features of conductive structure 24 are formed on the backside 16B of the first substrate 16. In the disclosed embodiment, one or more conductive material is deposited into the trenches 79 and trenches 78 to form respective TVs 26 and the BSM features 52 by a suitable deposition, such as PVD, electrochemical plating (ECP) deposition, other suitable deposition or a combination thereof. The conductive material includes copper, other suitable metal, or a combination thereof. A CMP process is further applied to remove the excessive deposited metal and planarize the top surface. A passivation layer 56 is further formed over the TVs 26 and the BSM features 52 on the backside 16B. The passivation layer 56 includes one or more dielectric materials, such as silicon oxide, silicon nitride, other suitable dielectric material or a combination thereof. The passivation layer 56 is patterned using lithograph process and etch to form openings in the passivation layer; and BRDL 54 and bond pads 50 are formed in the openings of the passivation layer 56. In the disclosed embodiment, the BRDL 54 includes RVBs 54A and backside redistribution metal lines 54B, and the formation of the BRDL 54 and the bond pads 50 includes two passivation layers and two patterning depositions. For example, the first passivation layer is deposited and patterned to form openings; the conductive material is deposited in the openings of the first passivation layer; a CMP process may be applied to the deposited conductive material; a patterning process is applied to the conductive material to form the BRDL 54 including the backside redistribution metal lines 54B; a second passivation layer is deposited and further patterned to form openings to expose portions of the backside redistribution metal lines 54B as bond pads 50. The BRDL 54 and the bond pads 50 may include aluminum, copper, aluminum alloys, copper alloys, other suitable metal, or a combination thereof. In the disclosed embodiment, each backside metal feature 52 spans a width greater than the width of the TV 26. In alternative embodiment, the backside metal feature 52 spans a width same as the width of the TV 26.

In some embodiments wherein the passivation layer 56 includes two layers, the first passivation layer includes a silicon nitride (SiN) layer and an un-doped silica glass (USG) layer on the SiN layer; and the second passivation layer includes an USG layer and a SiN layer disposed on the USG layer. The BRDL 54 may include multiple layers. In some embodiment, the BRDL 54 includes a barrier layer, a diffusion layer disposed on the barrier layer and an aluminum copper alloy layer disposed on the diffusion layer. The barrier layer may further include a tantalum film and a tantalum nitride film disposed on the tantalum film. The diffusion layer is a metal oxide. In the present embodiment, the diffusion layer includes tantalum, oxygen, aluminum, and nitrogen.

Figure 7A:
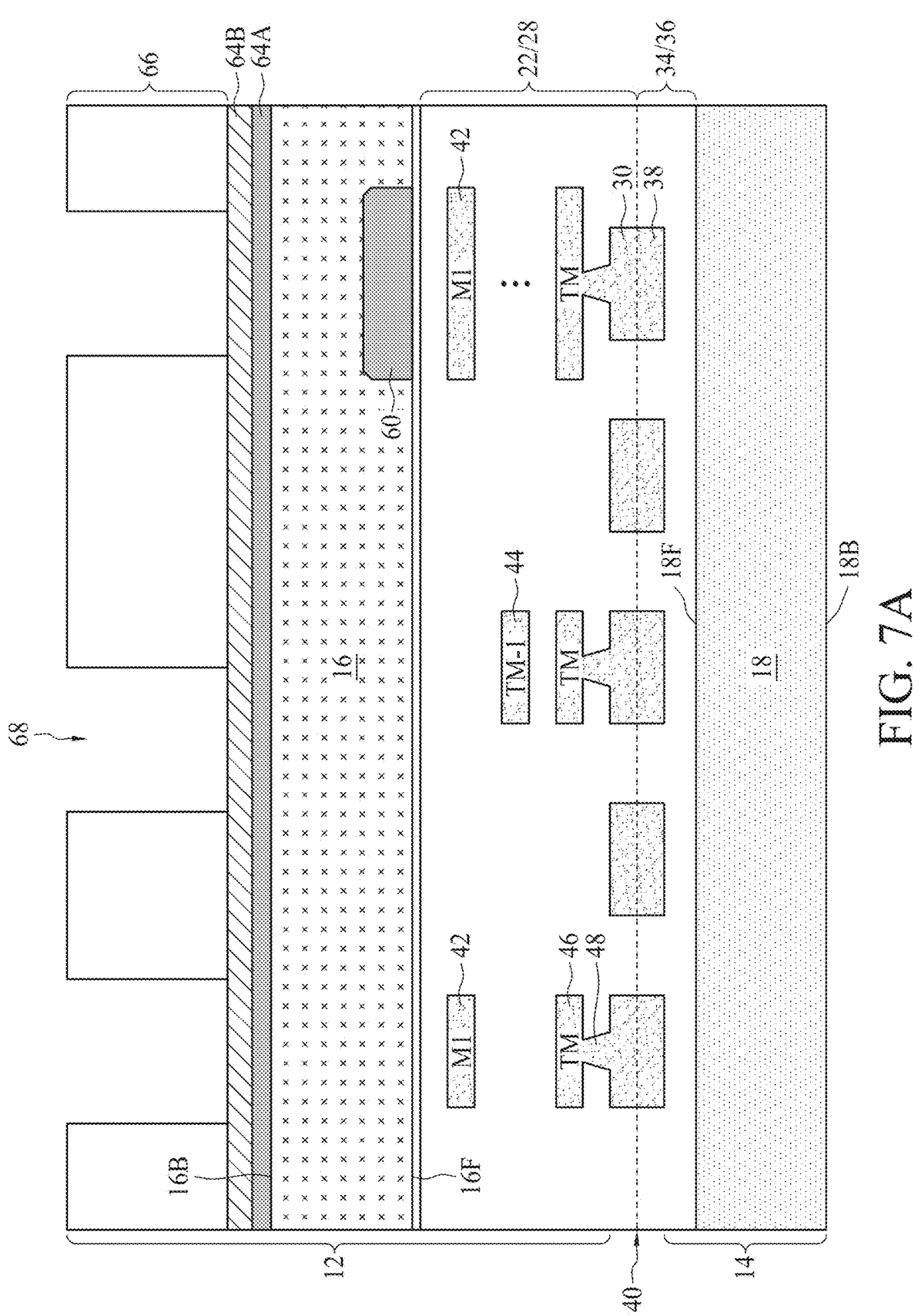
FIGS. 7A, 7B, 7C, 7D, 7E, 7F, and 7G are cross-sectional views of the IC structure of FIG. 1, in portion, at various fabrication stages, constructed according to various aspects of the present disclosure in some other embodiments.

The method making the IC structure 10 is further described in FIGS. 7A-7G according to some other embodiments. FIGS. 7A-7G are cross-sectional views of the IC structure 10 at various fabrication stages constructed according to various aspects of the present disclosure. The method is directed to the formation of the conductive structure 24 disposed on the backside 16B of the first substrate 16, especially TVs 26. In FIG. 7A, various features of the two workpieces 12 and 14, including devices 20 and 32, interconnect structures 22 and 34, frontside passivation layers 28 and 36, and contact pads 30 and 38 are formed on the frontside of the first and second substrates 16 and 18, respectively. The two workpieces 12 and 14 are bonded together and electrically connected through contact pads 30 and 38.

Referring to FIG. 7A, a hard mask 64 is formed on the backside of the first substrate 16. The hard mask 64 includes one or more dielectric layer. In the disclosed embodiment, the hard mask 64 includes two layers, such as a silicon oxide layer 64A formed by thermal oxidation and a silicon nitride layer 64B over the silicon oxide layer. The silicon nitride layer 64B may be formed by chemical vapor deposition (CVD). A patterned photoresist layer 66 is formed by a photolithography process that may further include coating, exposure, and development, and may further include various baking processes at different stages. The patterned photoresist layer 66 includes various openings 68 that define regions for the BSM features 52. Other features may be formed. For example, an etch stop layer, such as a silicon nitride layer, may be disposed on the frontside 16F of the first substrate 16.

Figure 7B:
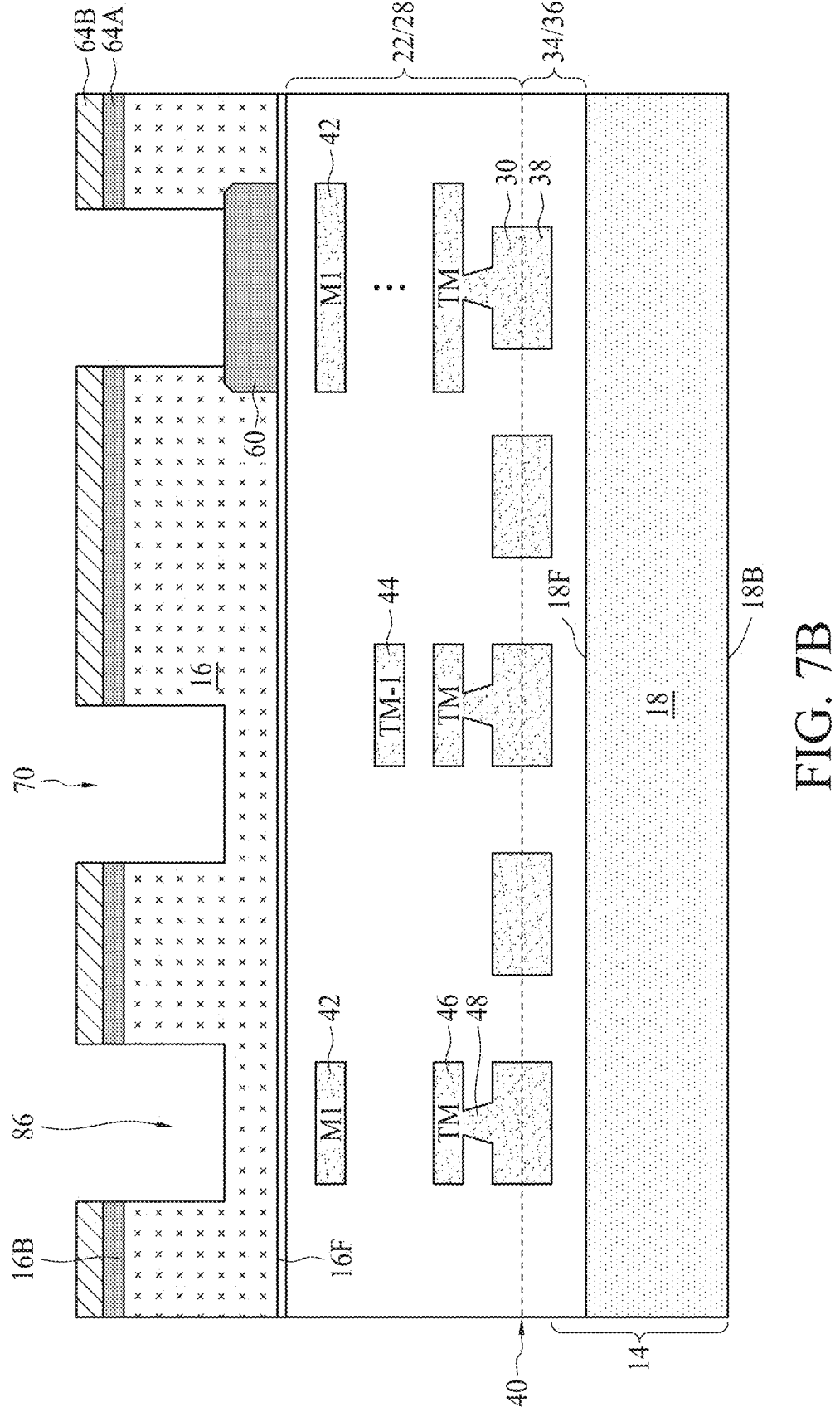

Referring to FIG. 7B, an etch process is applied to the hard mask through openings 68 of the patterned photoresist layer 66, thereby transferring the openings 68 to the hard mask 64, forming openings 70 in the hard mask 64. The etch process may include wet etch, dry etch, or a combination thereof, and may include multiple etch steps with respective etchants to selectively etch the hard mask 64. Different from FIG. 6B, the etch process collectively etch and open the hard mask layer 64, including first and second hard mask layers if both present, thereby forming openings 70 that expose the first substrate 16 and define regions for the BSM features 52. Accordingly, the etch process may include multiple etch steps with respective etchant, such as phosphorous acid, to etch the second hard mask layer 64B and hydrofluoric acid to etch the first hard mask layer 64A. Particularly, a subset of the openings 70 are aligned with a subset of the isolation features 60 in a top view and are intended to form TVs 26 there as well. The patterned photoresist layer 66 may be removed afterward by a suitable method, such as wet stripping or plasma ashing.

Still referring to FIG. 7B, another etch process is applied to the first substrate 16 using the hard mask 64 as an etch mask. The etch process is applied to the first substrate 16 through the openings 70 of the hard mask 64, thereby transferring the openings 70 to the first substrate 16 and forming trenches 86 in the first substrate 16. Especially, the etch process continues until the aligned isolation features 60 are exposed within the trenches 86. Accordingly, the trenches 86 for BSM features 52 have a depth reaching the isolation features 60. In furtherance of the embodiment, the first substrate 16 has a thickness Ts, the isolation features 60 have a thickness Ti, the isolation feature 60 is recessed from the first substrate 16 by H on the frontside 16F, and the trenches 86 have a depth Dt, then Dt=Ts−Ti−H.

Figure 7C:
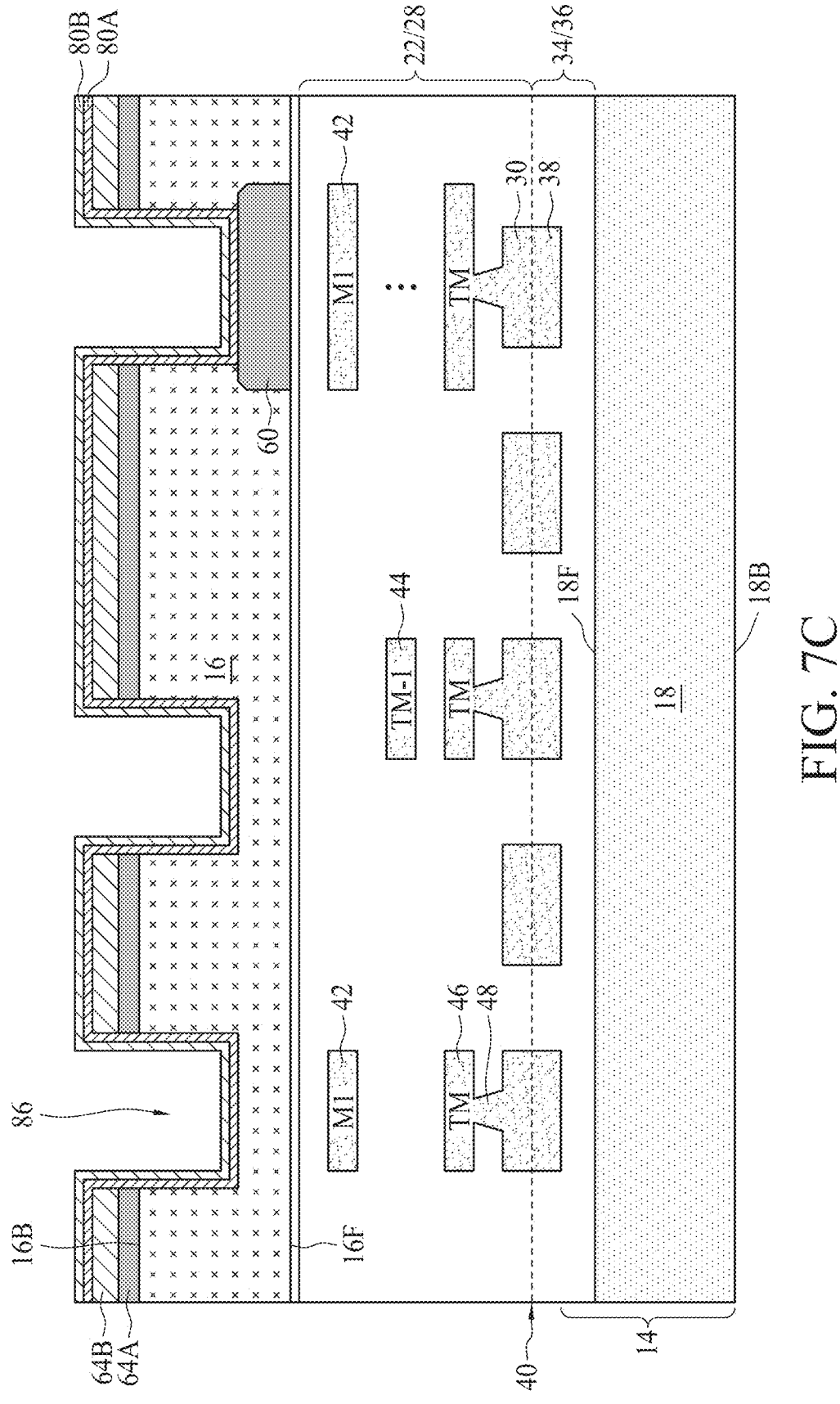

Referring to FIG. 7C, a dielectric material layer 80 is formed on various surfaces, including sidewalls and bottom surfaces of the trenches 86. The dielectric material layer includes one or more dielectric material, such as a silicon oxide layer 80A formed by thermal oxidation or CVD, and a silicon nitride layer 80B on the silicon oxide layer 80A formed by CVD.

Figure 7D:
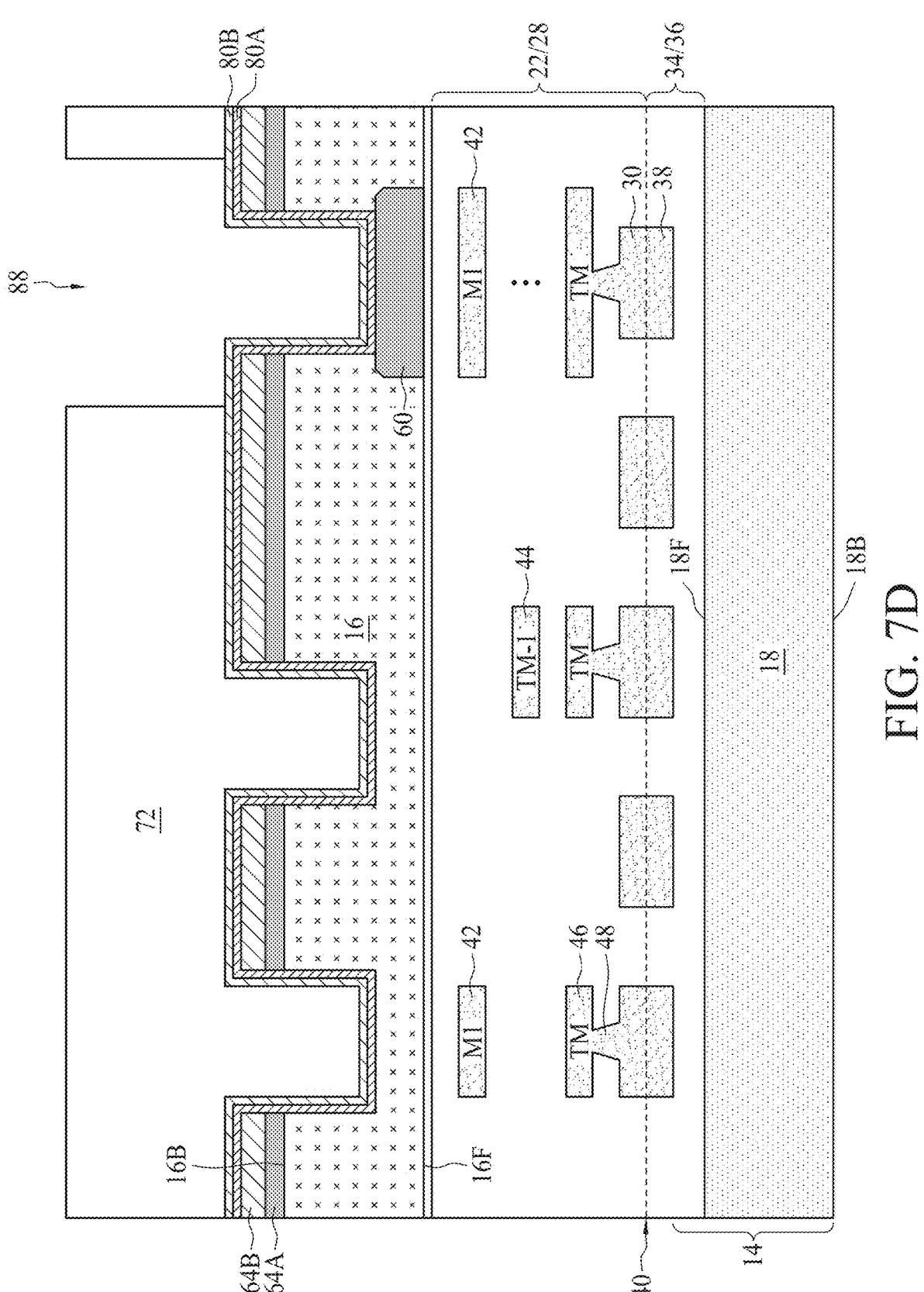

Referring to FIG. 7D, another patterned photoresist layer 72 is formed by a photolithography process. The patterned photoresist layer 72 includes openings 88 that define regions for the TVs 26. The patterned photoresist layer 72 may include more than one layers, such as a BARC layer and a photosensitive material layer being sensitive to the radiation of the exposure process used to pattern the photoresist layer 72.

Figure 7E:
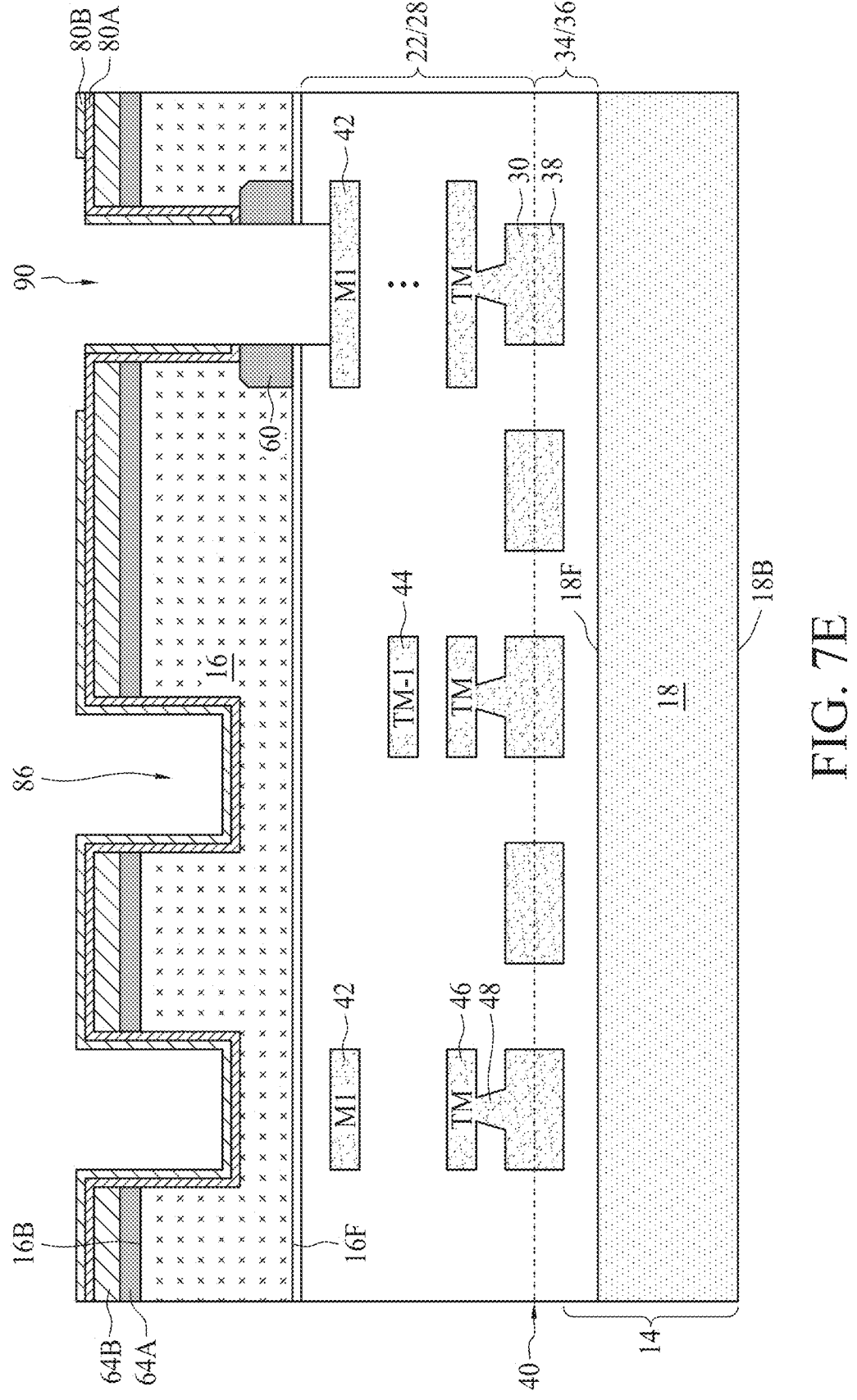

Referring to FIG. 7E, an etch process is applied to the first substrate 16 using the patterned photoresist layer 72 and the hard mask 64 collectively as an etch mask to etch through the dielectric material layer 80, the isolation features 60 and interlayer dielectric (ILD) layer of the interconnect structure 22 such that the first metal lines 42 are exposed within the openings 88. The etch process selectively etches various materials within the openings 88; may include wet etch, dry etch, or a combination thereof; and may include multiple etch steps with respective etchants to remove different materials within the openings 88. Accordingly, trenches 90 are formed for TVs 26 and the BSM features 52. It is noted that the trenches 90 for the corresponding the BSM features 52 and TVs 26 have a same width. The patterned photoresist layer 72 may be removed afterward by a suitable method, such as wet stripping or plasma ashing.

Figure 7F:
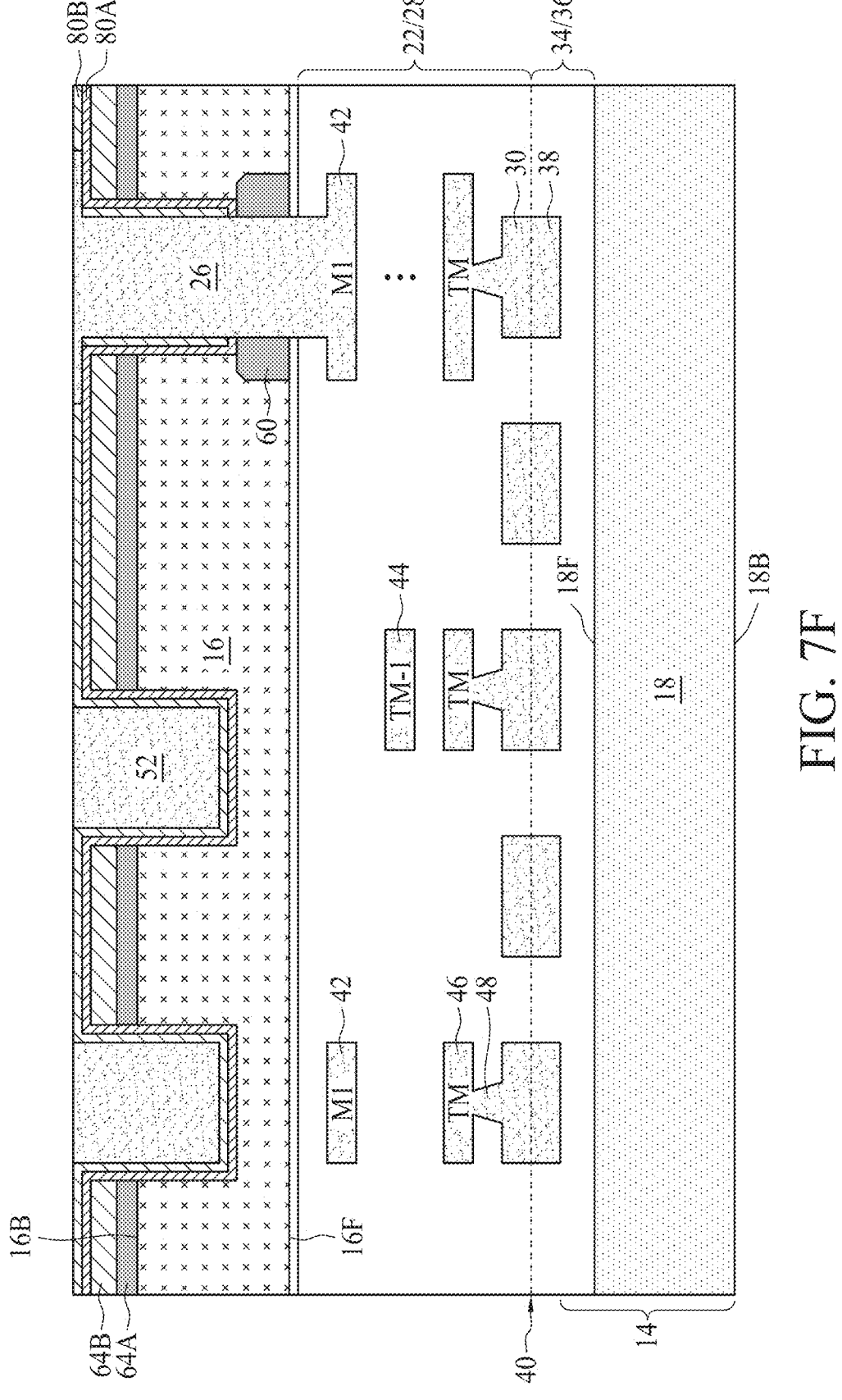

Referring to FIG. 7F, the TVs 26 and the BSM features 52 are formed on the backside 16B of the first substrate 16. In the disclosed embodiment, one or more conductive material is deposited into the trenches 86 and trenches 90 to form respective TVs 26 and the BSM features 52 by a suitable deposition, such as PVD, ECP deposition, other suitable deposition or a combination thereof. The conductive material includes copper, other suitable metal, or a combination thereof. A CMP process is further applied to remove the excessive deposited metal and planarize the top surface.

Figure 7G:
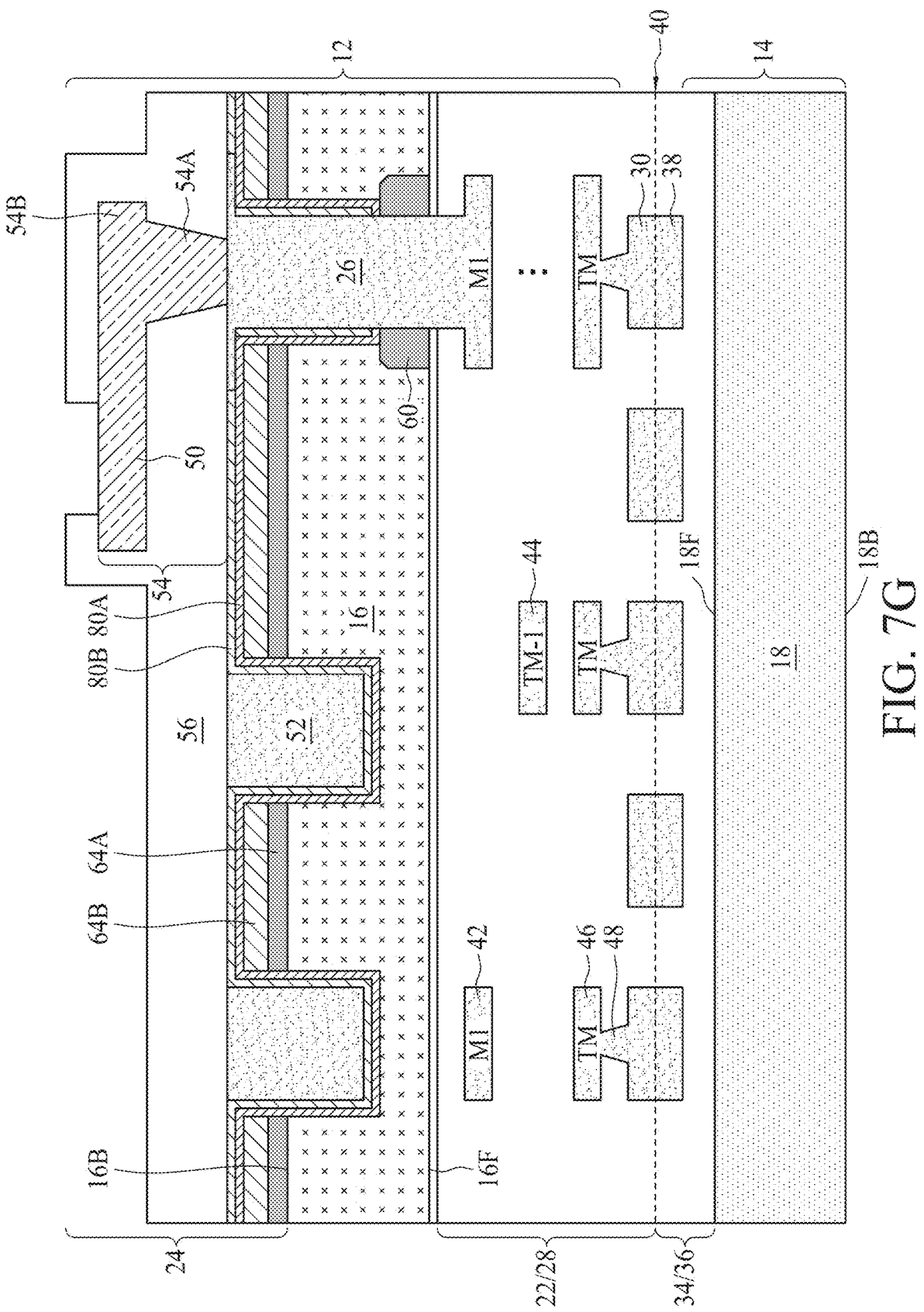

Referring to FIG. 7G, a passivation layer 56 is further formed over the TVs 26 and the BSM features 52. The passivation layer 56 includes one or more dielectric materials, such as silicon oxide, silicon nitride, other suitable dielectric material or a combination thereof. The passivation layer 56 is patterned using lithograph process and etch to form openings in the passivation layer; and BRDL 54 and bond pads 50 are formed in the openings of the passivation layer 56. In the disclosed embodiment, the BRDL 54 includes RVBs 54A and backside redistribution metal lines 54B, and the formation of the BRDL 54 and the bond pads 50 includes two passivation layers and two patterning depositions. For example, a first passivation layer is deposited and patterned to form openings; the conductive material is deposited in the openings of the first passivation layer; a CMP process may be applied to the deposited conductive material; a patterning process is applied to the conductive material to form the BRDL 54 including the backside redistribution metal lines 54B; a second passivation layer is deposited and further patterned to form openings to expose portions of the backside redistribution metal lines 54B as bond pads 50. The BRDL 54 and the bond pads 50 may include aluminum, other suitable metal, or a combination thereof.

In the disclosed embodiment in FIGS. 7A-7G, each backside metal feature 52 spans a width same as the width of the TV 26. Accordingly, the trenches for TVs 26 are formed by two patterning processes, including first patterning process described in FIGS. 7A-7C and a second patterning process described in FIGS. 7D-7F. Furthermore, the top surface (viewing from the backside 16B) of the isolation features 60 and the bottom surface of the BSM features 52 are at a same vertical level or coplanar.

Figure 8A:
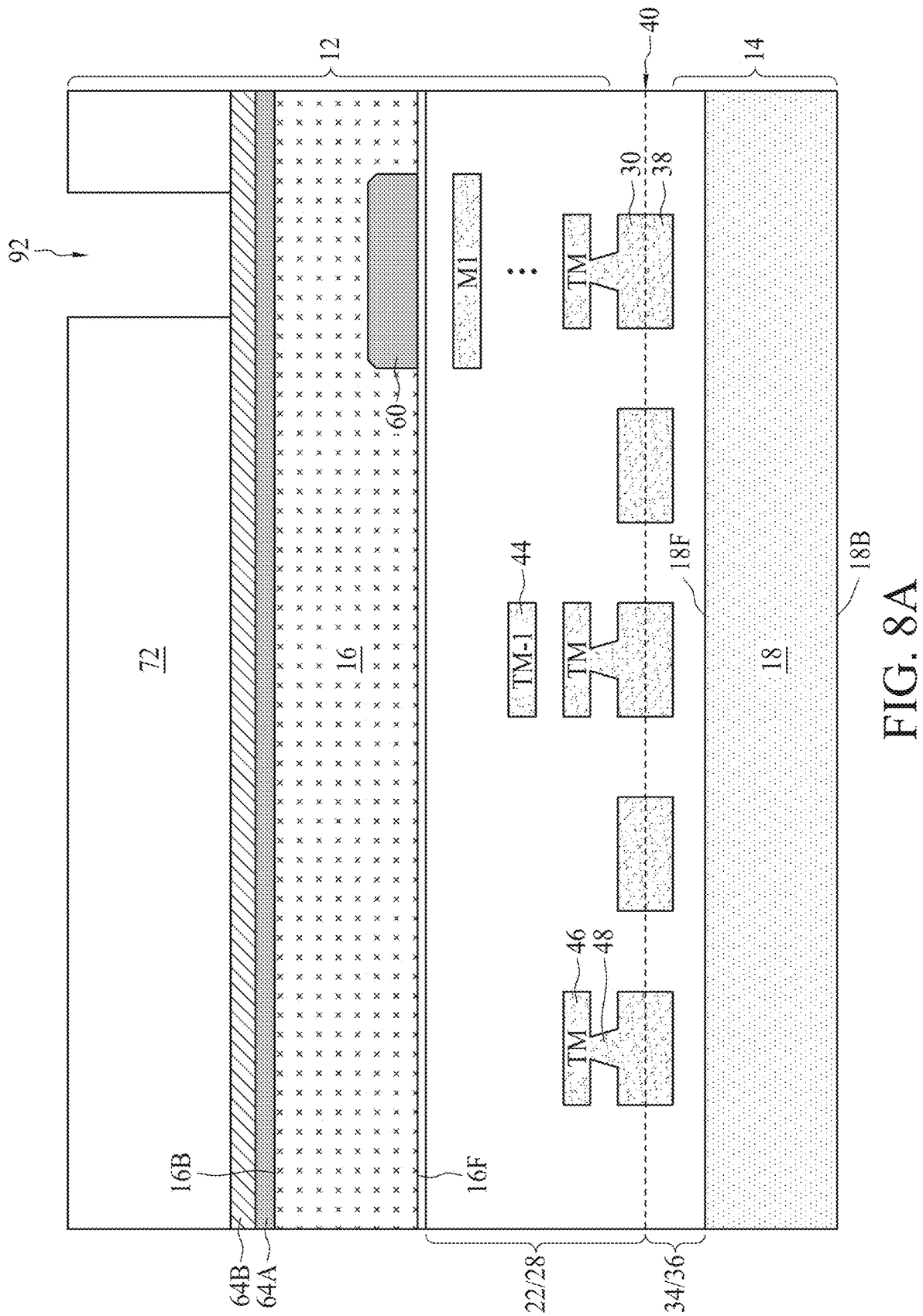
FIGS. 8A, 8B, 8C, 8D, 8E, 8F, 8G, and 8H are cross-sectional views of the IC structure of FIG. 1, in portion, at various fabrication stages, constructed according to various aspects of the present disclosure in some other embodiments.

The method making the IC structure 10 is further described according to FIGS. 8A-8H. FIGS. 8A-8H are cross-sectional views of the IC structure 10 at various fabrication stages constructed according to various aspects of the present disclosure. The method is directed to the formation of the conductive structure 24, especially TVs 26, formed on the backside 16B of the first substrate 16. In FIG. 8A, various features of the two workpieces 12 and 14, including devices 20 and 32, interconnect structures 22 and 34, frontside passivation layers 28 and 36, and contact pads 30 and 38 are formed on the frontside of the first and second substrates 16 and 18, respectively. The two workpieces 12 and 14 are bonded together and electrically connected through contact pads 30 and 38.

Referring to FIG. 8A, a hard mask 64 is formed on the backside of the first substrate 16. The hard mask 64 includes one or more dielectric layer. In the disclosed embodiment, the hard mask 64 includes two layers, such as a silicon oxide layer 64A formed by thermal oxidation and a silicon nitride layer 64B over the silicon oxide layer. The silicon nitride layer 64B may be formed by chemical vapor deposition (CVD). A photoresist layer 72 is formed by a photolithography process that may further includes coating, exposure, and development, and may further include various baking processes at different stages. The patterned photoresist layer 72 includes openings 92 that define regions for the TVs 26.

Figure 8B:
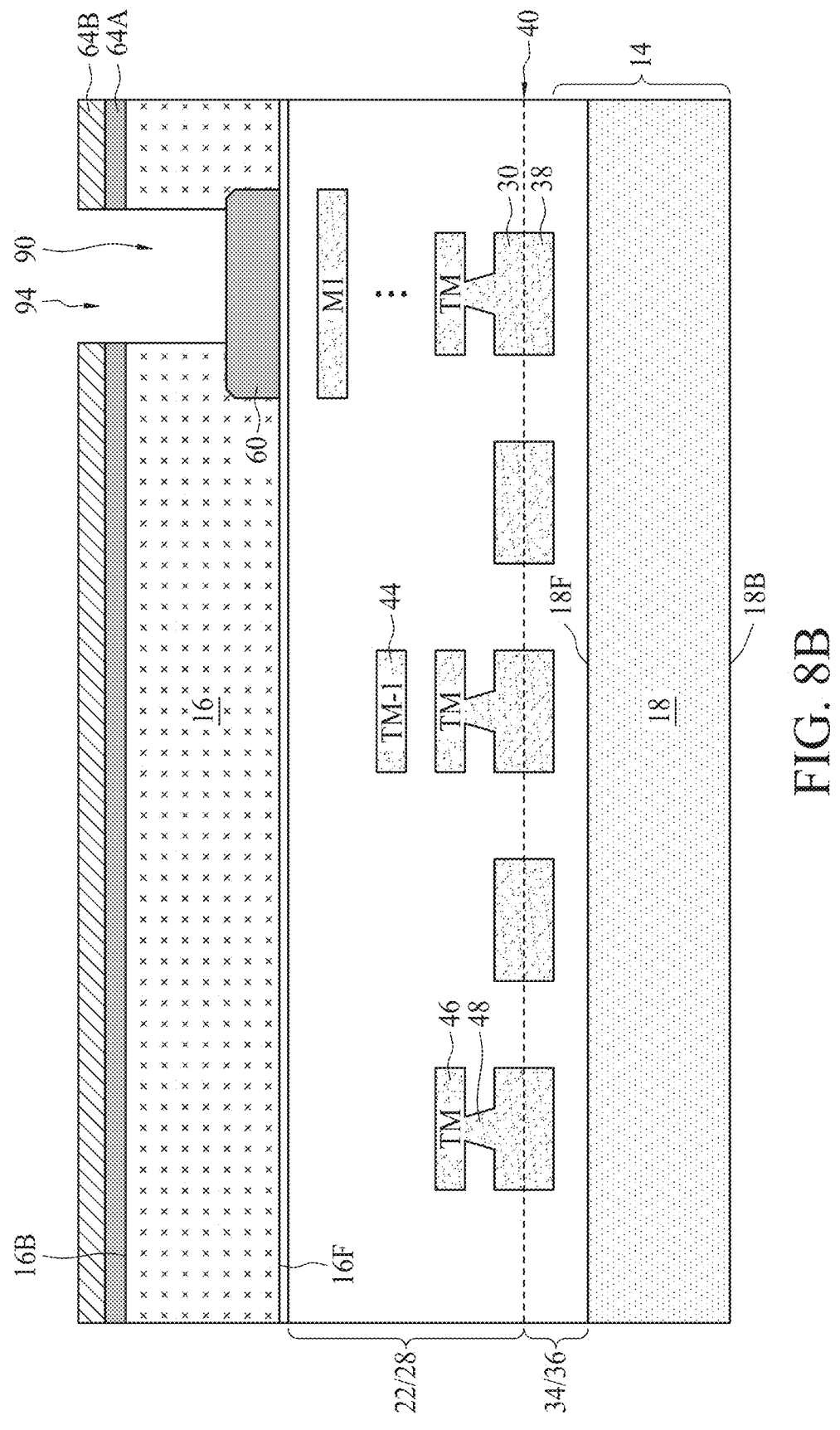

Referring to FIG. 8B, an etch process is applied to the hard mask through openings 92 of the patterned photoresist layer 72, thereby transferring the openings 92 to the hard mask 64, forming openings 94 in the hard mask 64. The etch process may include wet etch, dry etch, or a combination thereof, and may include multiple etch steps with respective etchants to selectively etch the hard mask 64. Different from FIG. 6B, the etch process collectively etch and open the hard mask layer 64, including first and second hard mask layers if both present, thereby forming openings 94 that expose the first substrate 16 and define regions for the TVs 26. Accordingly, the etch process may include multiple etch steps with respective etchant, such as phosphorous acid, to etch the second hard mask layer 64B and hydrofluoric acid to etch the first hard mask layer 64A. Particularly, the openings 94 are aligned with a subset of the isolation features 60 in a top view and are intended to form TVs 26 there. The patterned photoresist layer 72 may be removed afterward by a suitable method, such as wet stripping or plasma ashing.

Still referring to FIG. 8B, another etch process is applied to the first substrate 16 using the hard mask 64 as an etch mask. The etch process is applied to the first substrate 16 through the openings 94 of the hard mask 64, thereby transferring the openings 94 to the first substrate 16 and forming trenches 90 in the first substrate 16. Especially, the etch process continues until the aligned isolation features 60 are exposed within the openings 94.

Figure 8C:
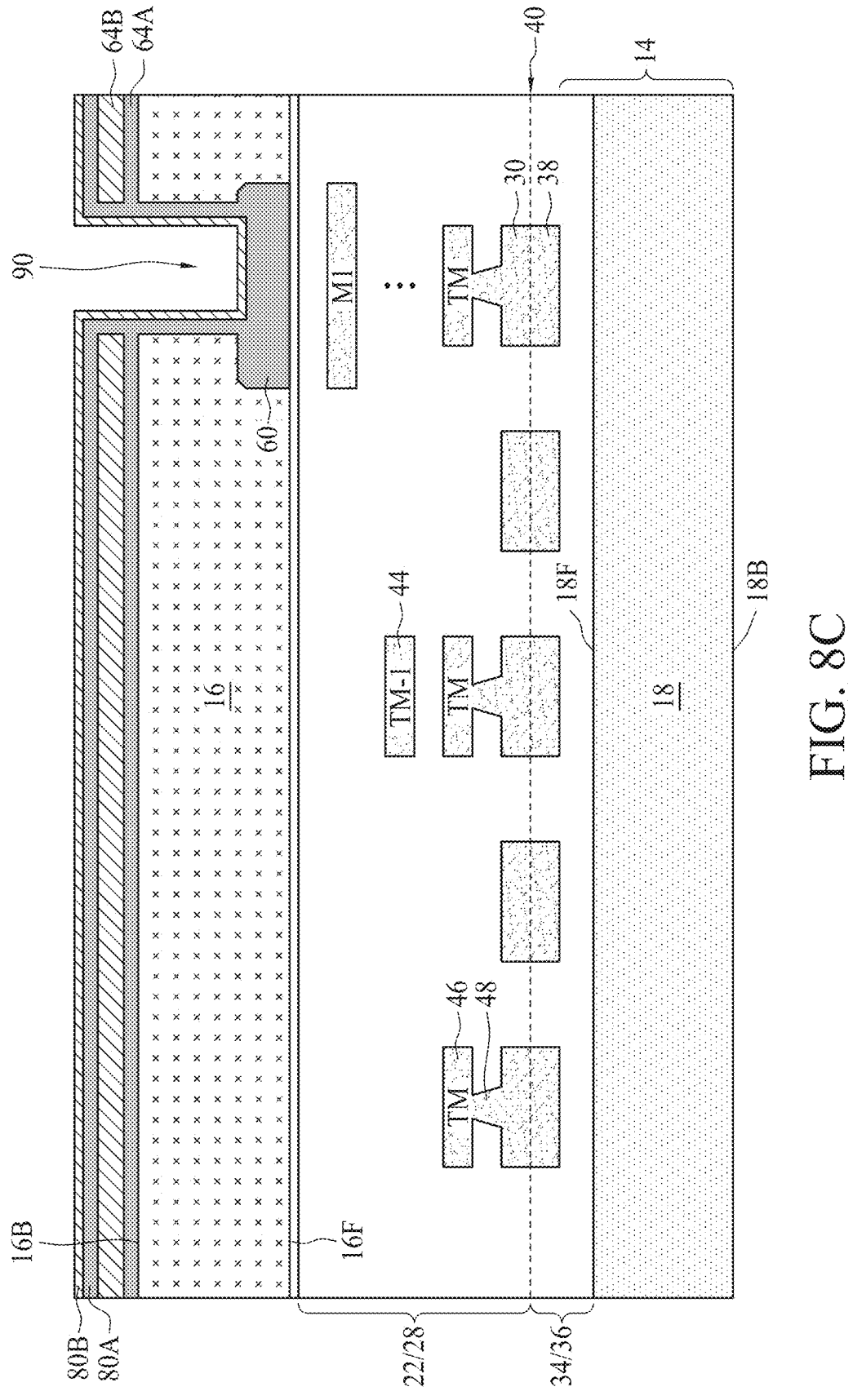

Referring to FIG. 8C, a dielectric material layer 80 is formed various surfaces, including sidewalls and bottom surfaces of the trenches 90. The dielectric material layer 80 includes one or more dielectric material, such as a silicon oxide layer 80A formed by thermal oxidation or CVD, and a silicon nitride layer 80B on the silicon oxide layer 80A formed by CVD.

Figure 8D:
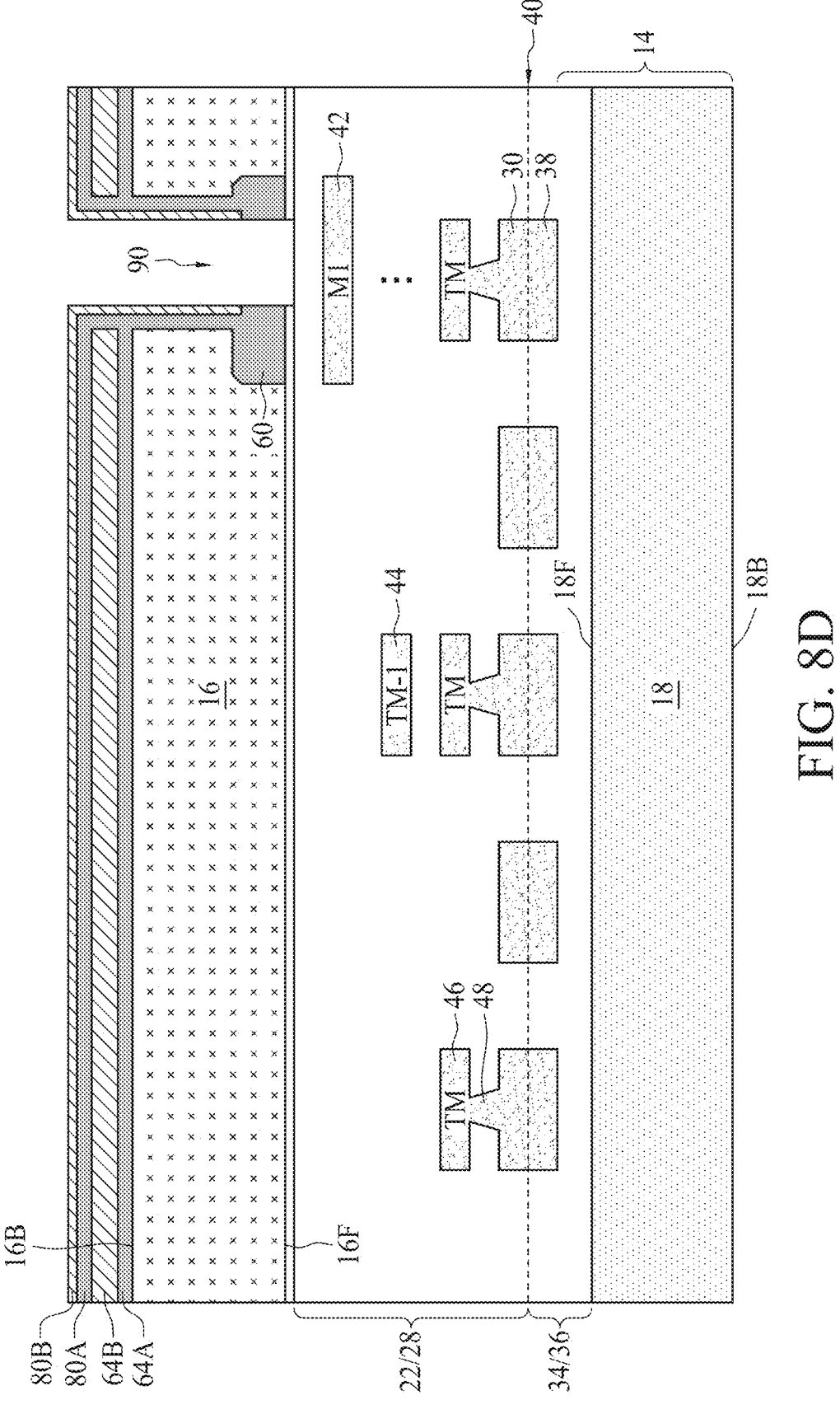

Referring to FIG. 8D, an etch process is applied to the first substrate 16 using the hard mask 64 as an etch mask to etch through the dielectric material layer 80, the isolation features 60 and interlayer dielectric (ILD) layer of the interconnect structure 22 such that the trenches 90 are deepened until the first metal lines 42 are exposed within the openings 94. The etch process selectively etches various materials within the openings 94; may include wet etch, dry etch, or a combination thereof; and may include multiple etch steps with respective etchants to remove different materials within the openings 94.

Figure 8E:
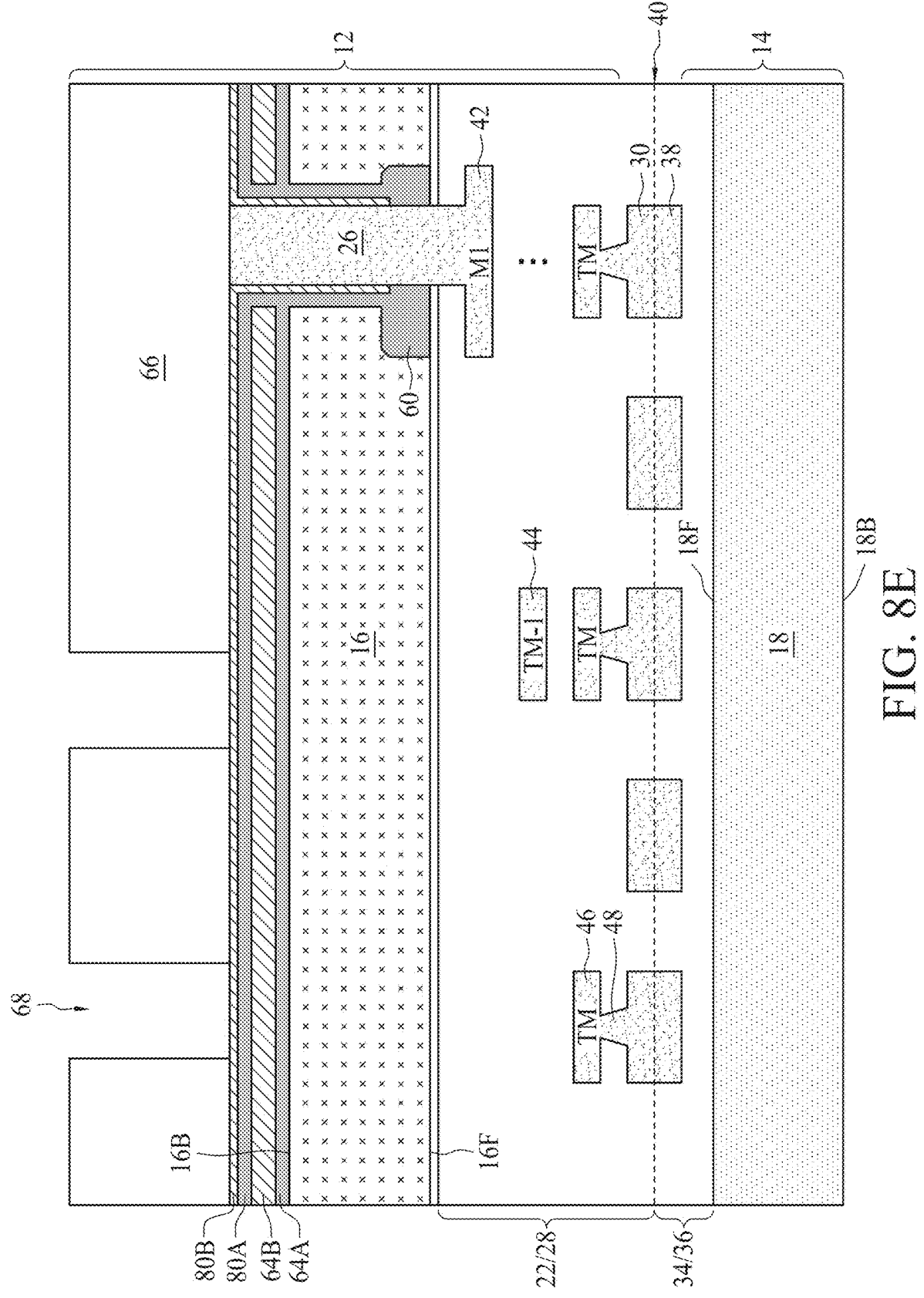

Referring to FIG. 8E, the TVs 26 are formed in the trenches 90 on the backside 16B of the first substrate 16. In the disclosed embodiment, one or more conductive material is deposited into the trenches 90 to form respective TVs 26 by a suitable deposition, such as PVD, ECP deposition, other suitable deposition or a combination thereof. The conductive material includes copper, other suitable metal, or a combination thereof. A CMP process is further applied to remove the excessive deposited metal and planarize the top surface.

Still referring to FIG. 8E, a photoresist layer 66 is formed by a photolithography process that may further includes coating, exposure, and development, and may further include various baking processes at different stages. The patterned photoresist layer 66 includes various openings 68 that define regions for the BSM features 52.

Figure 8F:
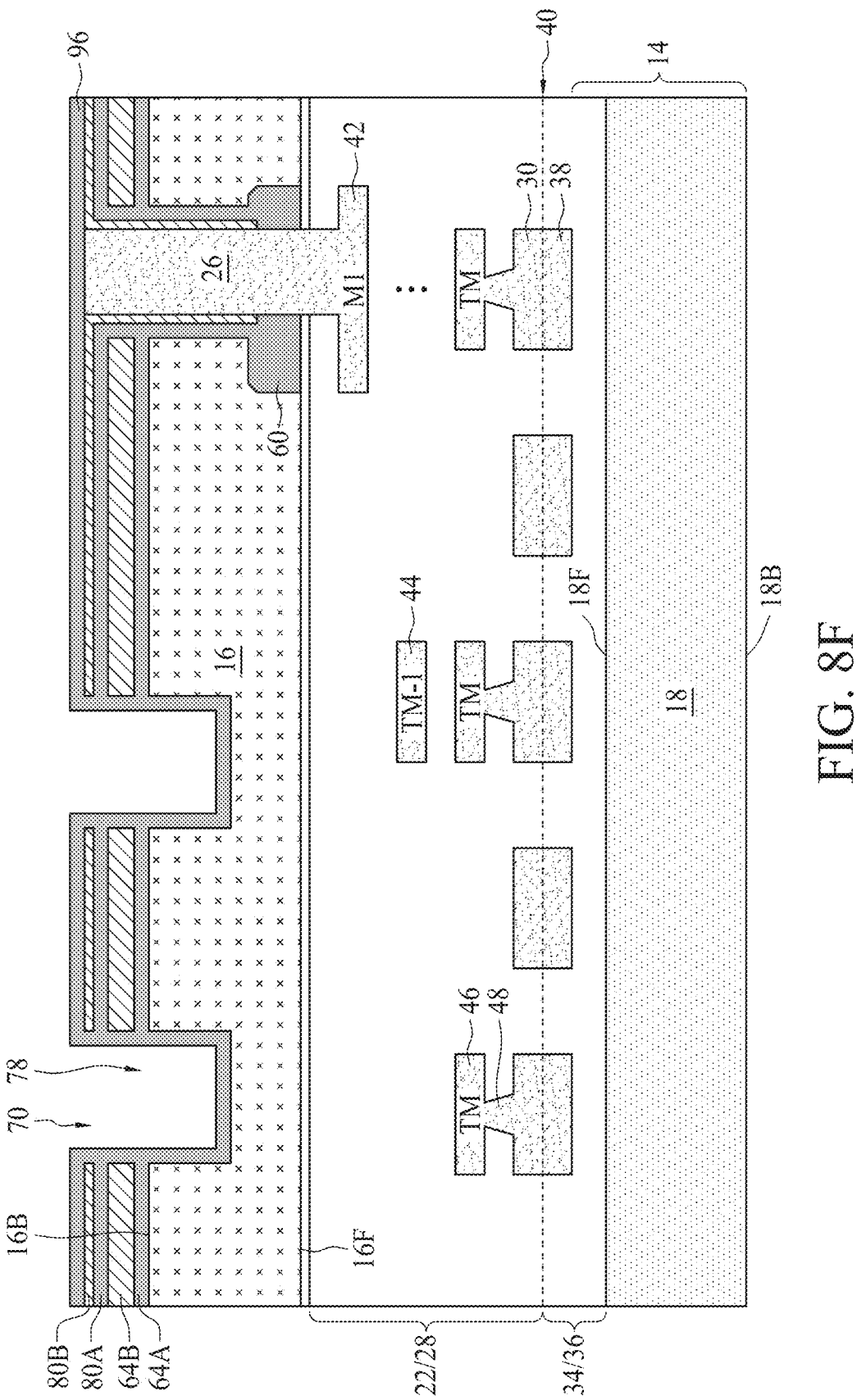

Referring to FIG. 8F, an etch process is applied to the hard mask 64 using the photoresist layer 66 as an etch mask, thereby transferring the openings 68 to the hard mask 64, forming the openings 70 in the hard mask 64. The etch process may include wet etch, dry etch, or a combination thereof, and may include multiple etch steps with respective etchants to selectively etch the hard mask 64. In the disclosed embodiment, the etch process collectively etch and open both the first hard mask layer 64A and the second hard mask layer 64B within openings 70 that define regions for the BSM features 52. Accordingly, the etch process may include multiple etch steps with respective etchant, such as phosphorous acid, to etch the second hard mask layer 64B and hydrofluoric acid to etch the first hard mask layer 64A. The patterned photoresist layer 66 may be removed afterward by a suitable method, such as wet stripping or plasma ashing.

In some embodiments, a dielectric material layer 96, similar to the dielectric material layer 80, such as silicon oxide, is deposited in the trenches 78 to form a conformal liner on sidewalls and bottom surfaces of the trenches 78 by a suitable method, such as thermal oxidation, CVD, other suitable method or a combination thereof.

Figure 8G:
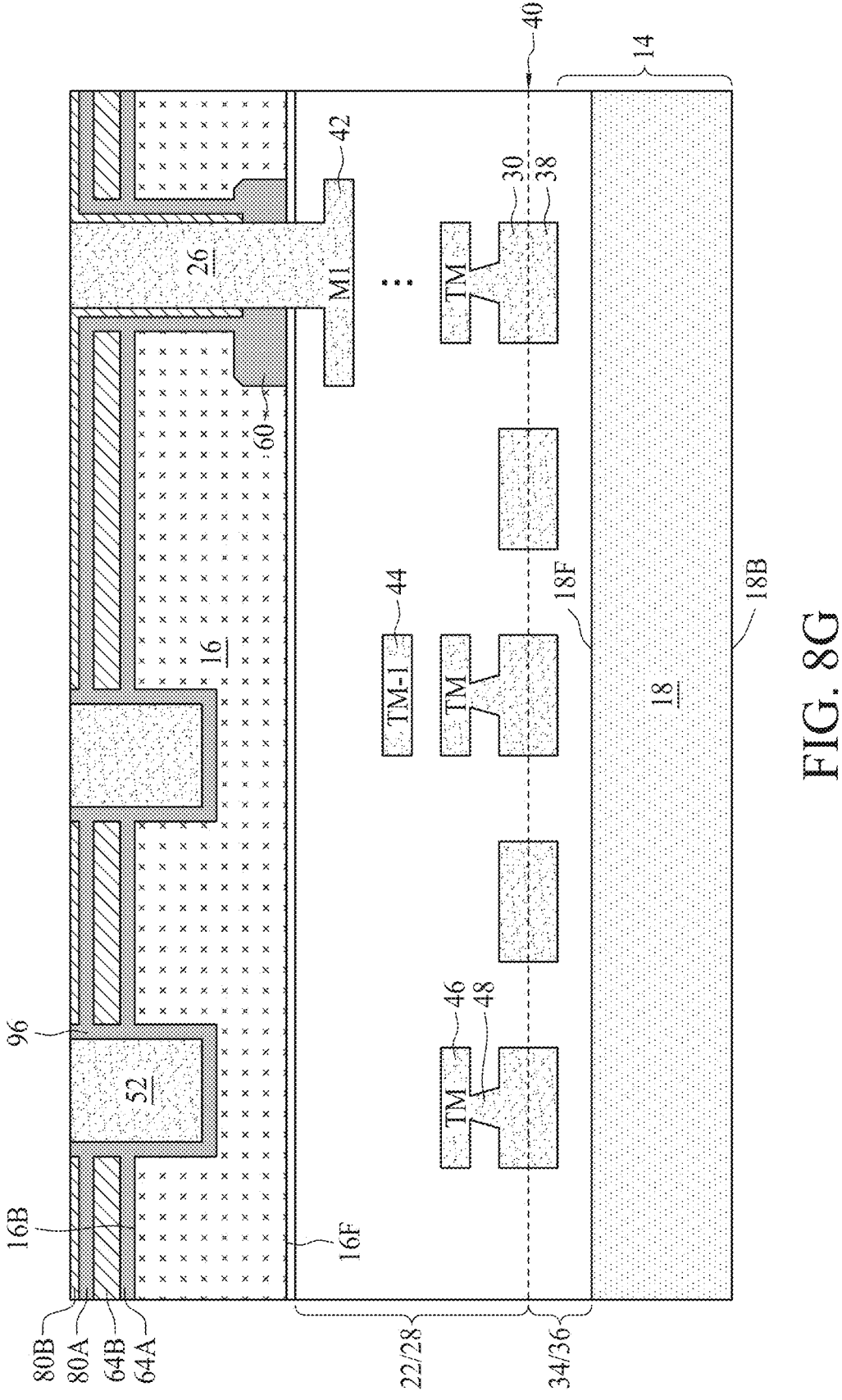

Referring to FIG. 8G, the BSM features 52 are formed in the trenches 78 on the backside 16B of the first substrate 16. In the disclosed embodiment, one or more conductive material is deposited into the trenches 78 to form the BSM features 52 by a suitable deposition, such as PVD, ECP deposition, other suitable deposition or a combination thereof. The conductive material includes copper, other suitable metal, or a combination thereof. A CMP process is further applied to remove the excessive deposited metal and planarize the top surface.

Figure 8H:
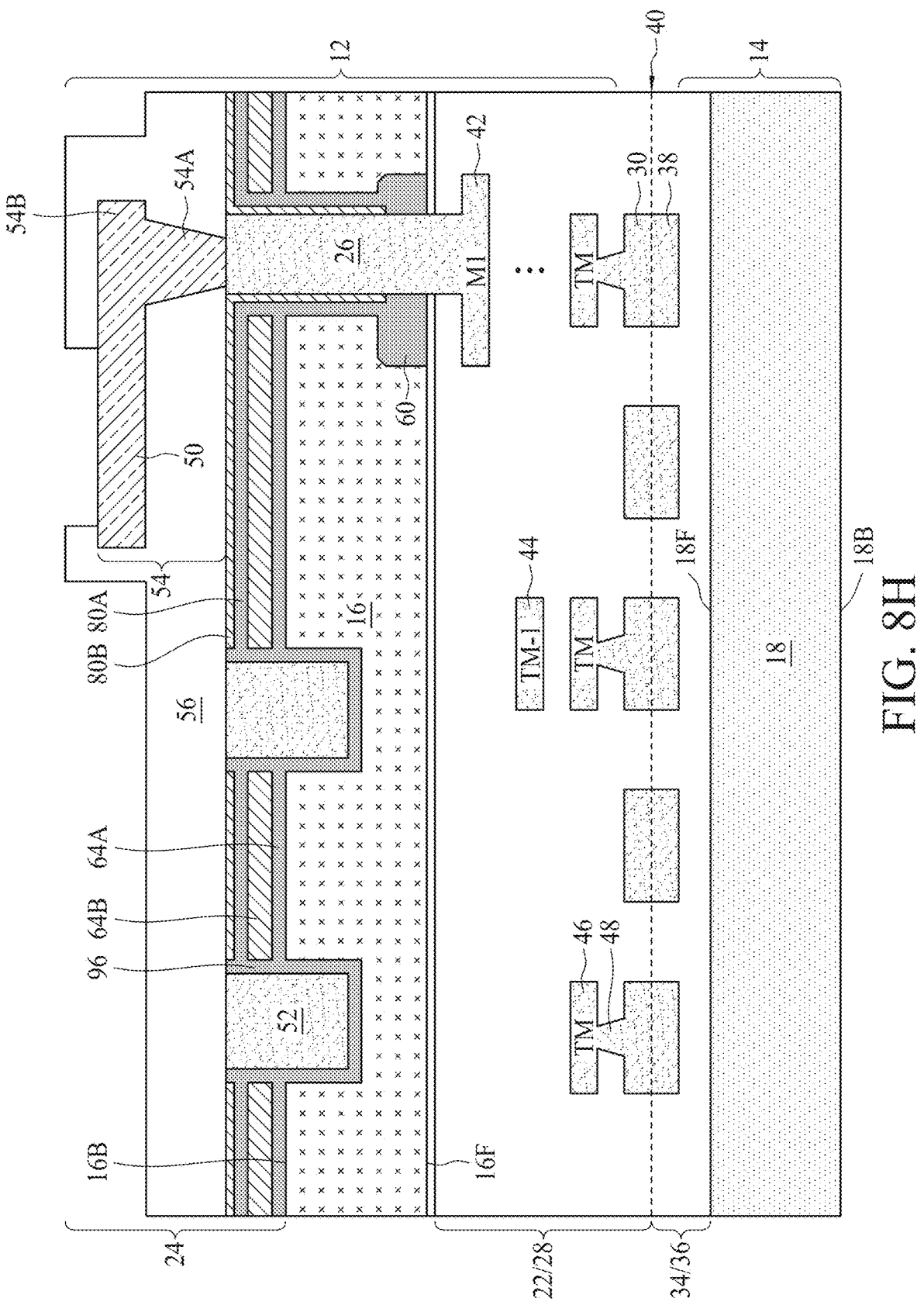

Referring to FIG. 8H, a passivation layer 56 is further formed over the TVs 26 and the BSM features 52. The passivation layer 56 includes one or more dielectric materials, such as silicon oxide, silicon nitride, other suitable dielectric material or a combination thereof. The passivation layer 56 is patterned using lithograph process and etch to form openings in the passivation layer; and BRDL 54 and bond pads 50 are formed in the openings of the passivation layer 56. In the disclosed embodiment, the BRDL 54 includes RVBs 54A and backside redistribution metal lines 54B, and the formation of the BRDL 54 and the bond pads 50 includes two passivation layers and two patterning depositions. For example, a first passivation layer is deposited and patterned to form openings; the conductive material is deposited in the openings of the first passivation layer; a CMP process may be applied to the deposited conductive material; a patterning process is applied to the conductive material to form the BRDL 54 including the backside redistribution metal lines 54B: a second passivation layer is deposited and further patterned to form openings to expose portions of the backside redistribution metal lines 54B as bond pads 50. The BRDL 54 and the bond pads 50 may include aluminum, other suitable metal, or a combination thereof.

In the disclosed embodiment in FIGS. 8A-8H, the TVs 26 extend vertical with the same width similar to FIG. 7G. However, the backside metal feature 52 and the TV 26 may span the same width or different widths since those are formed separately. Accordingly, TVs 26 and the backside metal feature 52 are formed separately, each by one patterning process. The method totally includes two patterning processes, including first patterning process described in FIGS. 8A-8D and a second patterning process described in FIGS. 8E-8H.

The present disclosure provides an IC structure and the method making the same. The IC structure includes two workpieces bonded together so to form a bonding interface between the frontside surfaces of two workpieces. The two workpieces are electrically connected through corresponding hybrid bonding layers. A conductive structure is formed on the backside of the first workpiece and is electrically connected to the interconnect structure through TVs. The IC structure further include BSM features formed on the backside of the first workpiece and connected with the TVs. The backside metal routing features are embedded in the first substrate of the first workpiece from the backside. The backside metal routing features are designed to provide functions including inductors and thermal dissipation. The TVs and the backside metal routing features are collectively formed and various methods making the same are provided in various embodiments. The disclosed IC structure provides a 3D IC integration with enhancement of power, performance, area and cost (PPAC).

One aspect of the present disclosure involves a method of fabricating an integrated circuit (IC) structure. The method includes forming first IC devices on a first frontside of a first semiconductor substrate and second IC devices on a second frontside of a second semiconductor substrate; forming a first contact pad over the first IC devices from the first frontside of the first semiconductor substrate and a second contact pad over the second IC device from the second frontside of the second semiconductor substrate; bonding the first contact pad to the second contact pad such that the first and second IC devices are electrically connected; and forming a conductive structure on a first backside of the first semiconductor substrate. The conductive structure includes a through via (TV), a backside metal (BSM) feature, and a backside redistribution layer (BRDL). The TV is extending through the first semiconductor substrate and electrically connected the first and second IC devices to the BRDL, and the BSM feature is extended into a portion of the first semiconductor substrate and electrically connected to the TV.

Another aspect of the present disclosure involves a method of fabricating an integrated circuit (IC) structure. The method includes forming first IC devices on a first frontside of a first substrate; forming an interconnect structure having a first metal line over the first IC devices; bonding the first substrate and a second substrate such that the first frontside of the first substrate and a second frontside of the second substrate are facing each other, the interconnect structure electrically coupling the first IC devices into an integrated circuit; performing a first patterning process from a first backside of the first substrate to form a first trench in the first substrate; performing a second patterning process to form a second trench in the first substrate and deepen the first trench such that a shallow trench isolation (STI) feature is exposed in the first trench; performing a third patterning process to further etch through the STI feature in the first trench to form a through hole such that the first metal line is exposed in the through hole; and filling the through hole and the second trench with a conductive material to form a through silicon via (TV) and a backside metal (BSM) feature, respectively.

Yet another aspect of the present disclosure involves an integrated circuit (IC) structure. The IC structure includes a first semiconductor substrate having first IC devices formed on a first frontside of the first semiconductor substrate, a first interconnect structure disposed on and coupling the first IC devices, and a first contact pad over the first interconnect structure; a second semiconductor substrate having second IC devices formed on a second frontside of the second semiconductor substrate, a second interconnect structure disposed on and coupling the second IC devices, and a second contact pad over the second interconnect structure, wherein the first contact pad is bonded to the second contact pad, and wherein the first and second IC devices are coupled through the first and second interconnect structure; a through via (TV) passing through the first semiconductor substrate; a backside metal (BSM) feature formed on a first backside of the first semiconductor substrate and extending a portion of the first semiconductor substrate; and a backside redistribution layer (BRDL) disposed on the BSM feature and electrically connected to the TV through the BSM feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating an integrated circuit (IC) structure, comprising:
  forming first IC devices on a first frontside of a first semiconductor substrate and second IC devices on a second frontside of a second semiconductor substrate;
  forming a first contact pad over the first IC devices from the first frontside of the first semiconductor substrate and a second contact pad over the second IC device from the second frontside of the second semiconductor substrate;
  bonding the first contact pad to the second contact pad such that the first and second IC devices are electrically connected; and
  forming a conductive structure on a first backside of the first semiconductor substrate, wherein the conductive structure includes a through via (TV), a backside metal (BSM) feature, and a backside redistribution layer (BRDL), and wherein
  the TV is extending through the first semiconductor substrate and electrically connected the first and second IC devices to the BRDL, and
  the BSM feature is extended into a portion of the first semiconductor substrate and electrically connected to the TV.

2. The method of claim 1, further comprising
  forming a shallow trench isolation (STI) feature on the first frontside of the first semiconductor substrate and defining active regions; and
  forming a first interconnect structure over the first IC devices and coupling the first IC devices into a first circuit, wherein the first interconnect structure includes a first metal line, and the first hybrid bonding layer are electrically connected to the first IC devices through the first interconnect structure.

3. The method of claim 2, wherein the forming a conductive structure further includes
  patterning the first semiconductor substrate from the first backside to form a through hole in the first semiconductor substrate such that the first metal line is exposed in the through hole;
  patterning the first semiconductor substrate from the first backside to form a BSM trench;
  filling the through hole and the BSM trench with a conductive material to form the TV and the BSM feature, respectively; and
  forming the BRDL over the TV and the BSM feature, the BRDL being embedded in a passivation layer.

4. The method of claim 3, wherein the patterning the first semiconductor substrate from the first backside to form a through hole in the first semiconductor substrate includes patterning the first semiconductor substrate to form the through hole penetrating through the STI feature.

5. The method of claim 4, wherein the patterning the first semiconductor substrate from the first backside to form a through hole in the first semiconductor substrate includes
  performing a first patterning process to form a first trench in the first semiconductor substrate;
  performing a second patterning process to deepen the first trench such that the STI feature is exposed in the deepened first trench; and
  performing a third patterning process to further etch through the STI feature in the first deepened trench to form the through hole such that the first metal line is exposed in the through hole.

6. The method of claim 5, wherein the performing a second patterning process to deepen the first trench also simultaneously form the BSM trench in the first semiconductor substrate.

7. The method of claim 6, wherein
the first interconnect structure is embedded in an interlayer dielectric (ILD) layer; and
the performing a third patterning process includes etch the ILD layer such that the first metal line is exposed.

8. The method of claim 6, wherein the filling the through hole and the BSM trench with a conductive material to form the TV and the BSM feature further includes applying a chemical mechanical polishing process to the conductive material to remove excessive portions of the conductive material.

9. The method of claim 4, wherein the patterning the first semiconductor substrate from the first backside to form a through hole in the first semiconductor substrate includes
performing a first patterning process to form a TV trench and a BSM trench in the first semiconductor substrate; and
performing a second patterning process to further etch through the STI feature in the TV trench to form the through hole such that the first metal line is exposed in the through hole.

10. The method of claim 4, wherein
the patterning the first semiconductor substrate from the first backside to form a through hole in the first semiconductor substrate includes performing a first patterning process to form the through hole such that the first metal line is exposed in the through hole; and
performing a second patterning process to form a TV trench in the first semiconductor substrate.

11. The method of claim 1, wherein the forming a conductive structure includes forming the BSM feature designed as an inductor.

12. A method of fabricating an integrated circuit (IC) structure, comprising:
forming first IC devices on a first frontside of a first substrate;
forming an interconnect structure having a first metal line over the first IC devices;
bonding the first substrate and a second substrate such that the first frontside of the first substrate and a second frontside of the second substrate are facing each other, the interconnect structure electrically coupling the first IC devices into an integrated circuit;
performing a first patterning process from a first backside of the first substrate to form a first trench in the first substrate;
performing a second patterning process to form a second trench in the first substrate and deepen the first trench such that a shallow trench isolation (STI) feature is exposed in the first trench;
performing a third patterning process to further etch through the STI feature in the first trench to form a through hole such that the first metal line is exposed in the through hole; and
filling the through hole and the second trench with a conductive material to form a through via (TV) and a backside metal (BSM) feature, respectively.

13. The method of claim 12, further comprising forming a backside redistribution layer (BRDL) and a bond pad over the TV and the BSM feature, the BRDL being embedded in a passivation layer.

14. The method of claim 13, wherein the bond pad is electrically connected to the TV through the BRDL and the BSM feature.

15. The method of claim 14, wherein the BSM feature includes a first portion designed as an inductor and a second portion designed as a thermal dissipation structure.

16. The method of claim 12, wherein
the interconnect structure is embedded in an interlayer dielectric (ILD) layer;
the performing a third patterning process includes etch the ILD layer such that the first metal line is exposed; and
the filling the through hole and the second trench with a conductive material to form a TV and a BSM feature further includes applying a chemical mechanical polishing process to the conductive material to remove excessive portions of the conductive material.

17. A method of fabricating an integrated circuit (IC) structure, comprising:
forming first IC devices on a first frontside of a first substrate;
forming an interconnect structure having a first metal line over the first IC devices;
bonding the first substrate and a second substrate such that the first frontside of the first substrate and a second frontside of the second substrate are facing each other, the interconnect structure electrically coupling the first IC devices into an integrated circuit;
performing a first patterning process from a first backside of the first substrate to form a first trench in the first substrate;
performing a second patterning process to form a second trench in the first substrate and deepen the first trench such that a shallow trench isolation (STI) feature is exposed in the first trench;
performing a third patterning process to further etch through the STI feature in the first trench to form a through hole such that the first metal line is exposed in the through hole;
filling the through hole and the second trench with a conductive material to form a through via (TV) and a backside metal (BSM) feature, respectively; and
forming a backside redistribution layer (BRDL) and a bond pad over the TV and the BSM feature.

18. The method of claim 17, wherein
the bond pad is electrically connected to the TV through the BRDL and the BSM feature; and
the BSM feature includes a first portion designed as an inductor and a second portion designed as a thermal dissipation structure.

19. The method of claim 17, wherein
the interconnect structure is embedded in an interlayer dielectric (ILD) layer; and
the BRDL being embedded in a passivation layer.

20. The method of claim 19, wherein
the performing a third patterning process includes etching the ILD layer such that the first metal line is exposed; and
the filling the through hole and the second trench with a conductive material to form a TV and a BSM feature further includes applying a chemical mechanical polishing process to the conductive material to remove excessive portions of the conductive material.

* * * * *